United States Patent
Kodama

(10) Patent No.: US 10,016,969 B2
(45) Date of Patent: Jul. 10, 2018

(54) PRINTING APPARATUS AND PRINTING METHOD

(71) Applicant: FUJIFILM CORPORATION, Tokyo (JP)

(72) Inventor: Kenichi Kodama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/592,978

(22) Filed: May 11, 2017

(65) Prior Publication Data

US 2017/0246853 A1    Aug. 31, 2017

Related U.S. Application Data

(63) Continuation of application No. PCT/JP2015/079593, filed on Oct. 20, 2015.

(30) Foreign Application Priority Data

Nov. 13, 2014  (JP) ................................ 2014-230281

(51) Int. Cl.
*B41F 9/00* (2006.01)
*B41F 9/06* (2006.01)
(Continued)

(52) U.S. Cl.
CPC .............. *B41F 9/003* (2013.01); *B41F 9/061* (2013.01); *B41F 33/0027* (2013.01);
(Continued)

(58) Field of Classification Search
CPC ...... B41F 9/003; B41F 9/061; B41F 33/0027; B41F 35/02; B41J 2/01; B41J 2002/012;
(Continued)

(56) References Cited

U.S. PATENT DOCUMENTS 4,833,486 A * 5/1989 Zerillo .................. B41C 1/1066
101/450.1
4,942,813 A * 7/1990 Arai ........................ B41F 11/00
101/152
(Continued)

FOREIGN PATENT DOCUMENTS

JP    2002-287322 A    10/2002
JP    2005-081726 A    3/2005
(Continued)

OTHER PUBLICATIONS

Notification of Transmittal of Translation of the International Preliminary Report on Patentability (Chapter I) and Translation of Written Opinion of the International Searching Authority; PCT/JP2015/079593; dated May 26, 2017.
(Continued)

*Primary Examiner* — David Banh
(74) *Attorney, Agent, or Firm* — Studebaker & Brackett PC

(57) ABSTRACT

A printing apparatus applies ink to a surface of a printing plate in the shape of a predetermined pattern and then transfers the ink to a substrate. The printing apparatus includes: an image recording section that applies the ink to the surface of the printing plate; a plate surface observation unit that acquires information about the surface of the printing plate; a storage section that stores information about a reference shape serving as a reference of the surface of the printing plate; and a determination section that compares the information about the reference shape stored in the storage section with the information about the surface of the printing plate, which is obtained by the plate surface observation unit, and determines whether or not the surface of the printing plate to which the ink has been applied is present in a predetermined range of the reference shape.

11 Claims, 16 Drawing Sheets

(51) Int. Cl.
   *B41F 35/02* (2006.01)
   *B41F 33/00* (2006.01)
   *B41M 1/10* (2006.01)
   *B41J 2/01* (2006.01)
   *H01L 21/288* (2006.01)
   *H01L 29/66* (2006.01)

(52) U.S. Cl.
   CPC .............. *B41F 35/02* (2013.01); *B41J 2/01* (2013.01); *B41M 1/10* (2013.01); *H01L 21/288* (2013.01); *H01L 29/66742* (2013.01); *B41J 2002/012* (2013.01); *B41P 2200/10* (2013.01); *B41P 2235/24* (2013.01)

(58) Field of Classification Search
   CPC .. B41M 1/10; H01L 21/288; H01L 29/66742; B41P 2200/10; B41P 2235/24
   See application file for complete search history.

(56) References Cited

U.S. PATENT DOCUMENTS

| | | | |
|---|---|---|---|
| 6,648,468 B2* | 11/2003 | Shinkoda | B41J 2/0057 347/103 |
| 2004/0055491 A1* | 3/2004 | Munz | B41F 33/0081 101/485 |
| 2004/0179717 A1* | 9/2004 | Furukawa | G06T 7/001 382/112 |

FOREIGN PATENT DOCUMENTS

| | | | |
|---|---|---|---|
| JP | 2008-258249 A | | 10/2008 |
| JP | 2010-091965 A | | 4/2010 |
| JP | 2011-005734 A | | 1/2011 |
| JP | 2014-061653 A | | 4/2014 |
| JP | 2014177050 A | * | 9/2014 |
| JP | 2014-188741 A | | 10/2014 |

OTHER PUBLICATIONS

International Search Report issued in PCT/JP2015/079593; dated Dec. 22, 2015.

Written Opinion issued in PCT/JP2015/079593 dated Dec. 22, 2015.

An Office Action issued by the Japanese Patent Office on Feb. 20, 2018, which corresponds to Japanese Patent Application No. 2016-558948 and is related to U.S. Appl. No. 15/592,978; with English translation.

* cited by examiner

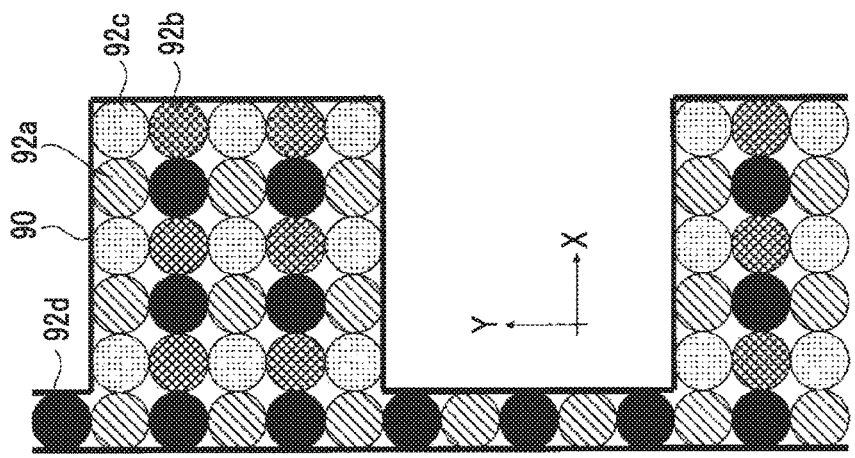
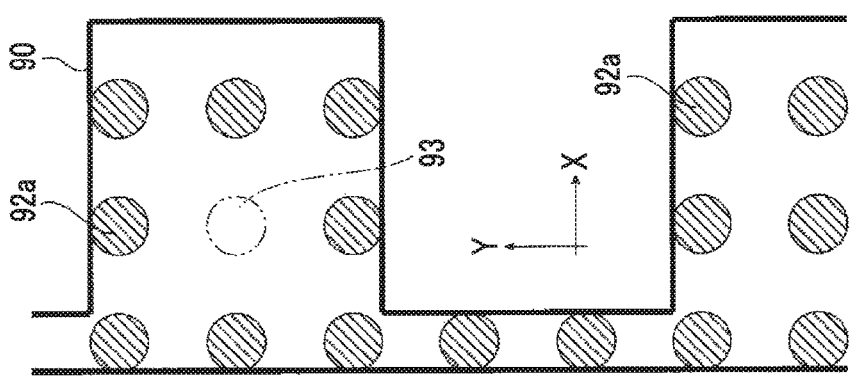
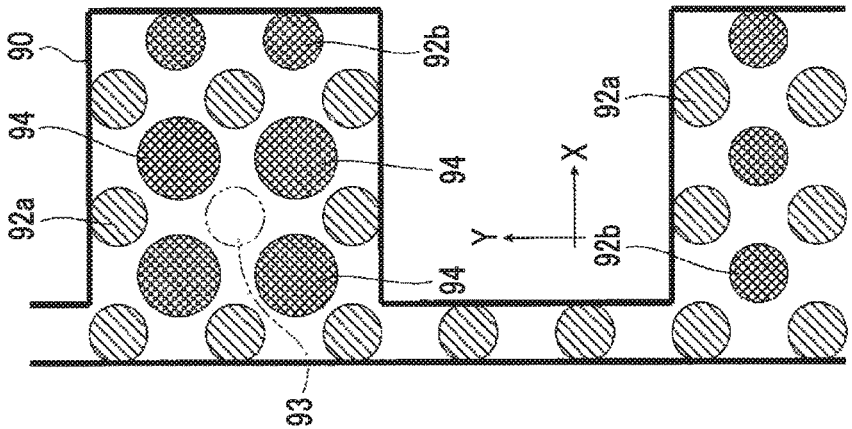

FIG. 13A
FIG. 13B
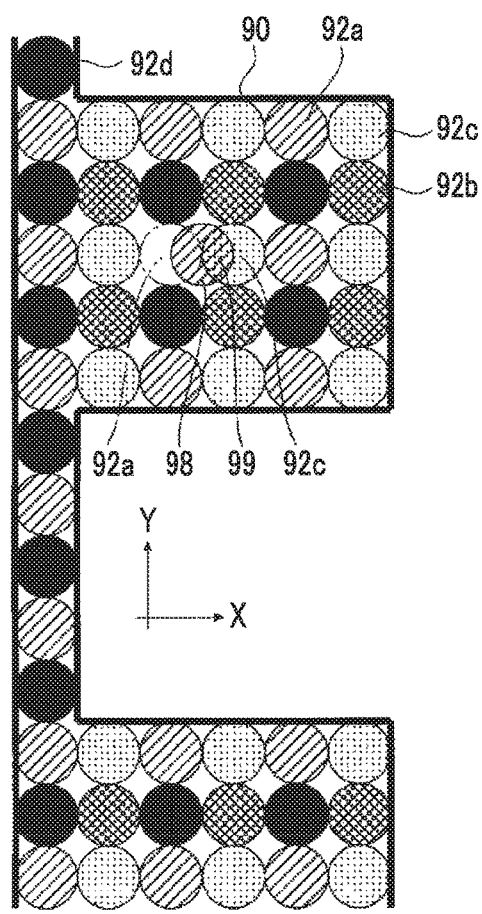
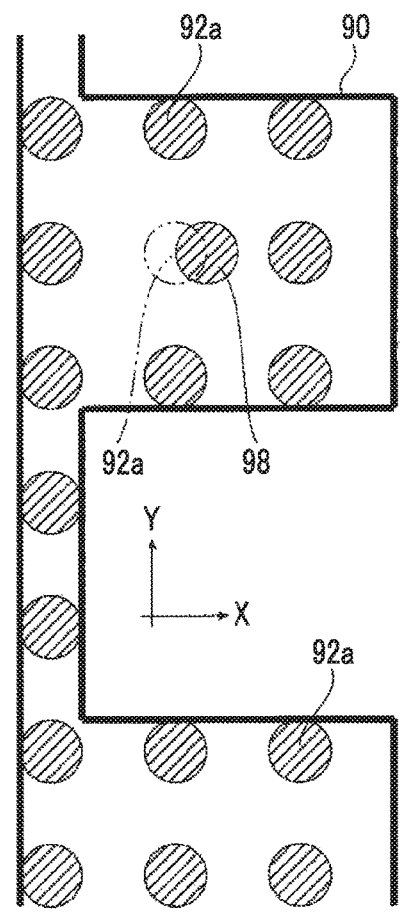

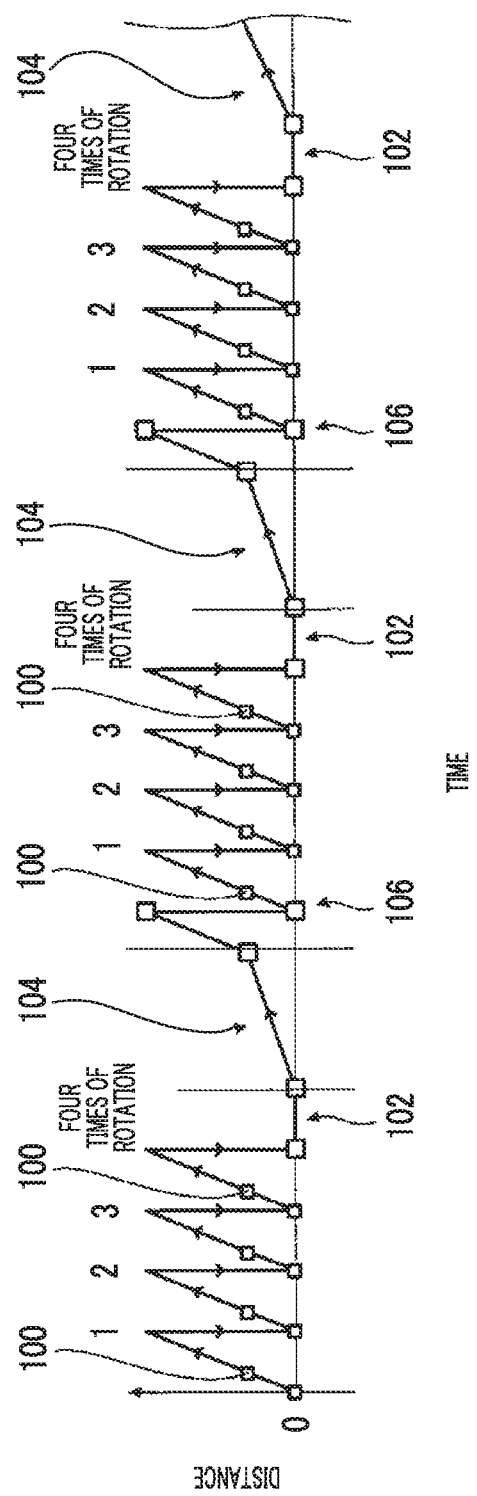

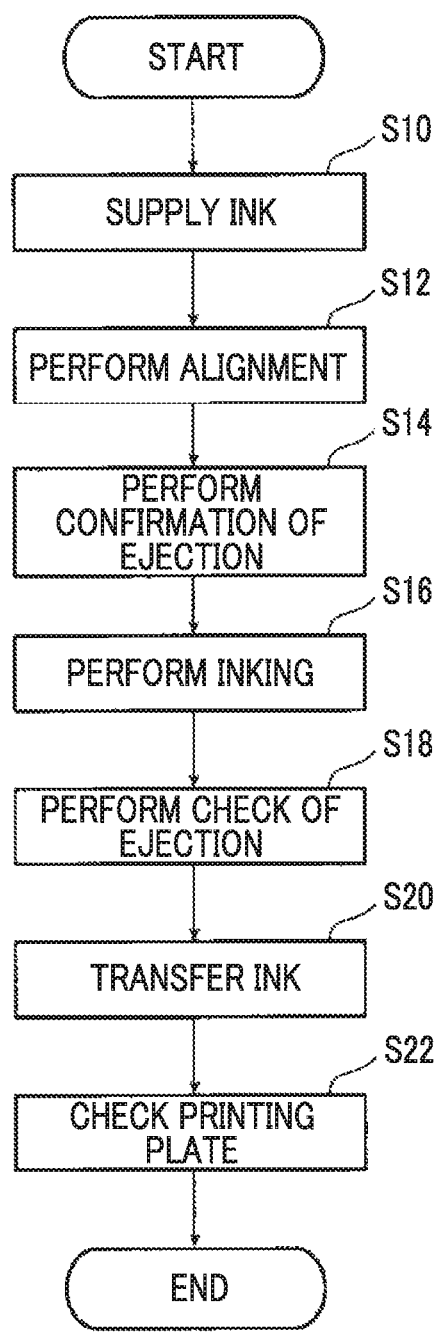

(1)

PRINTING APPARATUS AND PRINTING METHOD

CROSS-REFERENCE TO RELATED APPLICATIONS

This application is a Continuation of PCT International Application No. PCT/JP2015/079593 filed on Oct. 20, 2015, which claims priority under 35 U.S.C. § 119(a) to Japanese Patent Application No. 2014-230281 filed on Nov. 13, 2014. The above application is hereby expressly incorporated by reference, in its entirety, into the present application.

BACKGROUND OF THE INVENTION

1. Field of the Invention

The present invention relates to a printing apparatus and a printing method of which printing accuracy is improved without the complication of the structure of the apparatus, and more particularly, to a printing apparatus and a printing method that can be used to form a gate electrode, a source electrode, a drain electrode, wires, and the like of a thin-film transistor used in electronic paper and the like.

2. Description of the Related Art

In recent years, gate electrode, source electrodes, drain electrodes, and metal wiring of thin-film transistors and fine patterns, such as electrical wiring patterns, have been formed on a glass substrate, a resin substrate, or the like by using a printing method. A substrate on which fine patterns are formed with liquid containing conductive particles, such as metal, by a printing method is used in thin display devices, such as electronic paper and a liquid crystal display, a portable communication device, and the like.

In a pattern printing apparatus disclosed in JP2005-81726A, a thin resin layer is provided on a flexible metal flat-plate-shaped intaglio plate and an ink repellent pattern is formed thereon to form recessed portions. Ink is sprayed and supplied to the recessed portions from below by the ink jet of ink supply means. After the ink is supplied, a solvent is vaporized from the ink, which is present in the recessed portions, by ink drying means so that the ink is dried without losing viscosity. A printing target and the flexible metal flat-plate-shaped intaglio plate are positioned, and the flexible metal flat-plate-shaped intaglio plate is pressed by a press/release cylinder of ink transfer means while the printing target and the flexible metal flat-plate-shaped intaglio plate are made to roll. As a result, the ink, which is present in the recessed portions, is transferred to the printing target. After the ink is transferred, the flexible metal flat-plate-shaped intaglio plate is released while being bent.

JP2008-258249A discloses a pattern forming apparatus that is to accurately and easily form fine patterns on an object. In the pattern forming apparatus disclosed in JP2008-258249A, a substrate to be processed is placed on a stage and a first pattern forming unit acquires the position of a letterpress plate relative to a predetermined reference mark provided on a plate cylinder. Here, in the pattern forming apparatus, the letterpress plates of the first and second pattern forming units are replaced according to a pattern to be formed on the substrate. Accordingly, the position of the letterpress plate provided on the outer peripheral surface of a plate cylinder is slightly changed whenever the letterpress plate is replaced. In the first pattern forming unit, the position of the letterpress plate relative to the reference mark on the outer peripheral surface of the plate cylinder is acquired by a plate cylinder-imaging part immediately before a first pattern is formed on the substrate. Accordingly, a deviation from an ideal position is acquired.

JP2014-61653A discloses a letterpress printing apparatus that prints a pattern on a printing target substrate by using a letterpress plate. The letterpress printing apparatus disclosed in JP2014-61653A includes printing means and pattern check means. The printing means includes a letterpress plate, a plate cylinder on which the letterpress plate is mounted on the surface thereof, an ink supply unit that supplies ink to the surface of the letterpress plate, and a moving platen on which a substrate is placed and which transports the substrate. The pattern check means includes a check roller that is included in a moving mechanism of the moving platen and a check unit that checks a pattern printed on the check roller. In JP2014-61653A, ink is transferred to the check roller from the plate cylinder and the outer peripheral surface of the check roller is imaged to check the pattern, so that defects of an ink pattern caused by a defect and the like of the plate are detected before printing is performed on the substrate or the like.

An image forming apparatus disclosed in JP2010-91965A has a function to transport continuous-form paper, on which an image is formed with oil-based ink and which is carried in, by a transport roller, a function to form an image on the continuous-form paper by a printer unit, and an ink half-dry detection function to detect the half dry of ink on the image-formation surface of the continuous-form paper by an ink transfer detecting unit when offset printing processing and printer printing processing are performed.

The ink transfer detecting unit is provided with a CCD (charge-coupled device) sensor that images the surface of an ink transfer roller, a pressure roller that allows the continuous-form paper to be in pressure contact with the peripheral surface of the ink transfer roller, and a stepping motor that allows the pressure roller to reciprocate in the direction of an arrow E. In regard to the half dry of ink, the image-formation surface of the continuous-form paper is made to be in pressure contact with the peripheral surface of the ink transfer roller by the pressure roller, and the CCD sensor detects whether or not oil-based ink adheres to the peripheral surface of the ink transfer roller.

SUMMARY OF THE INVENTION

Various apparatuses have been proposed in the past as described above. The apparatus, which presses the flexible metal flat-plate-shaped intaglio plate to transfer ink, which is present in the recessed portions, to the printing target, is disclosed in JP2005-81726A, but does not perform the correction and the like of the ink pattern. Further, the pattern forming apparatus disclosed in JP2008-258249A finds a deviation from the ideal position of the first pattern, but does not perform the correction and the like of the pattern. There is a problem that printing accuracy deteriorates when an error occurs during the formation of a pattern.

Since the check roller is required in JP2014-61653A and JP2010-91965A, the structure of the apparatus becomes complicated. For this reason, there is a problem that the cost of the apparatus is increased.

An object of the invention is to solve the problems based on the above-mentioned related art and is to provide a printing apparatus and a printing method of which printing accuracy is improved without the complication of the structure of the apparatus.

In order to achieve the object, the invention provides a printing apparatus that applies ink to a surface of a printing plate in the shape of a predetermined pattern and then transfers the ink applied in the shape of the pattern to a substrate. The apparatus comprises: an image recording section that applies the ink to the surface of the printing plate; a plate surface observation unit that acquires information about the surface of the printing plate to which the ink has been applied; a storage section that stores information about a reference shape serving as a reference of the surface of the printing plate to which ink has been applied; and a determination section that compares the information about the reference shape stored in the storage section with the information about the surface of the printing plate to which the ink has been applied, which is obtained by the plate surface observation unit, and determines whether or not the surface of the printing plate to which the ink has been applied is present in a predetermined range of the reference shape.

It is preferable that the printing apparatus further comprises a restoration section that restores the surface of the plate on the basis of a determination result of the determination section.

It is preferable that the plate surface observation unit is to acquire information about the surface of the printing plate from which the ink applied to the printing plate in the shape of the predetermined pattern has been transferred to the substrate and the determination section determines whether or not the surface of the printing plate to which the ink has been applied is present in a predetermined range of the reference shape, by using information about the surface of the printing plate obtained before and after the transfer of the ink to the substrate.

It is preferable that the application of the ink to the surface of the printing plate is performed multiple times, and the plate surface observation unit acquires information about the surface of the printing plate whenever the ink is applied to the surface of the printing plate.

The image recording section uses, for example, an ink jet method.

For example, the printing plate is an intaglio plate, and the ink is applied to a recessed portion formed in the shape of a pattern.

The invention provides a printing method that applies ink to a surface of a printing plate in the shape of a predetermined pattern and then transfers the ink applied in the shape of the pattern to a substrate. The method comprises: a step of applying ink to the surface of the printing plate; an acquisition step of acquiring information about the surface of the printing plate to which the ink has been applied; and a determination step of comparing the information about a reference shape serving as a reference of the surface of the printing plate to which ink has been applied with the information about the surface of the printing plate to which the ink has been applied, and determining whether or not the surface of the printing plate to which the ink has been applied is present in a predetermined range of the reference shape.

It is preferable that the printing method further comprises a restoration step of restoring the surface of the plate on the basis of a result of the determination step.

It is preferable that the printing method further comprises: a step of acquiring information about the surface of the printing plate after transferring the ink, which is applied to the printing plate in the shape of the predetermined pattern, to the substrate; and a step of determining whether or not the surface of the printing plate to which the ink has been applied is present in a predetermined range of the reference shape, by using information about the surface of the printing plate obtained before and after the transfer of the ink to the substrate. It is preferable that the application of the ink to the surface of the printing plate is performed multiple times, and information about the surface of the printing plate is acquired whenever the ink is applied to the surface of the printing plate.

The application of the ink to the surface of the printing plate is performed by, for example, an ink jet method.

For example, the printing plate is an intaglio plate, and the ink is applied to a recessed portion formed in the shape of a pattern.

According to the invention, it is possible to provide a printing apparatus and a printing method of which printing accuracy is improved without the complication of the structure of the apparatus.

BRIEF DESCRIPTION OF THE DRAWINGS

FIG. 9A is a schematic diagram showing a state in which ink has been applied to a pattern, FIG. 9B is a schematic diagram showing a state in which first ink has been applied to the pattern, and FIG. 9C is a schematic diagram showing a state in which second ink has been applied to the pattern.

FIG. 13A is a schematic diagram showing a state in which fourth ink has been applied to a pattern, and FIG. 13B is a schematic diagram showing a state in which first ink has been applied to the pattern.

FIG. 14 is a schematic diagram illustrating a printing method of an embodiment of the invention.

FIG. 15 is a flow chart illustrating the printing method of the embodiment of the invention.

DESCRIPTION OF THE PREFERRED EMBODIMENTS

A printing apparatus and a printing method of the invention will be described in detail below on the basis of preferred embodiments shown in the accompanying drawings. The invention is not limited to the printing apparatus and the printing method of embodiments to be described below.

"~" representing the range of a numerical value to be described below includes numerical values that are written on both sides of "~". For example, a fact that E is in the range of a numerical value α~a numerical value β means that the range of E is a range including the numerical value α and the numerical value β, and is expressed as "$\alpha \leq \varepsilon \leq \beta$" by mathematical symbols.

Figure 1:
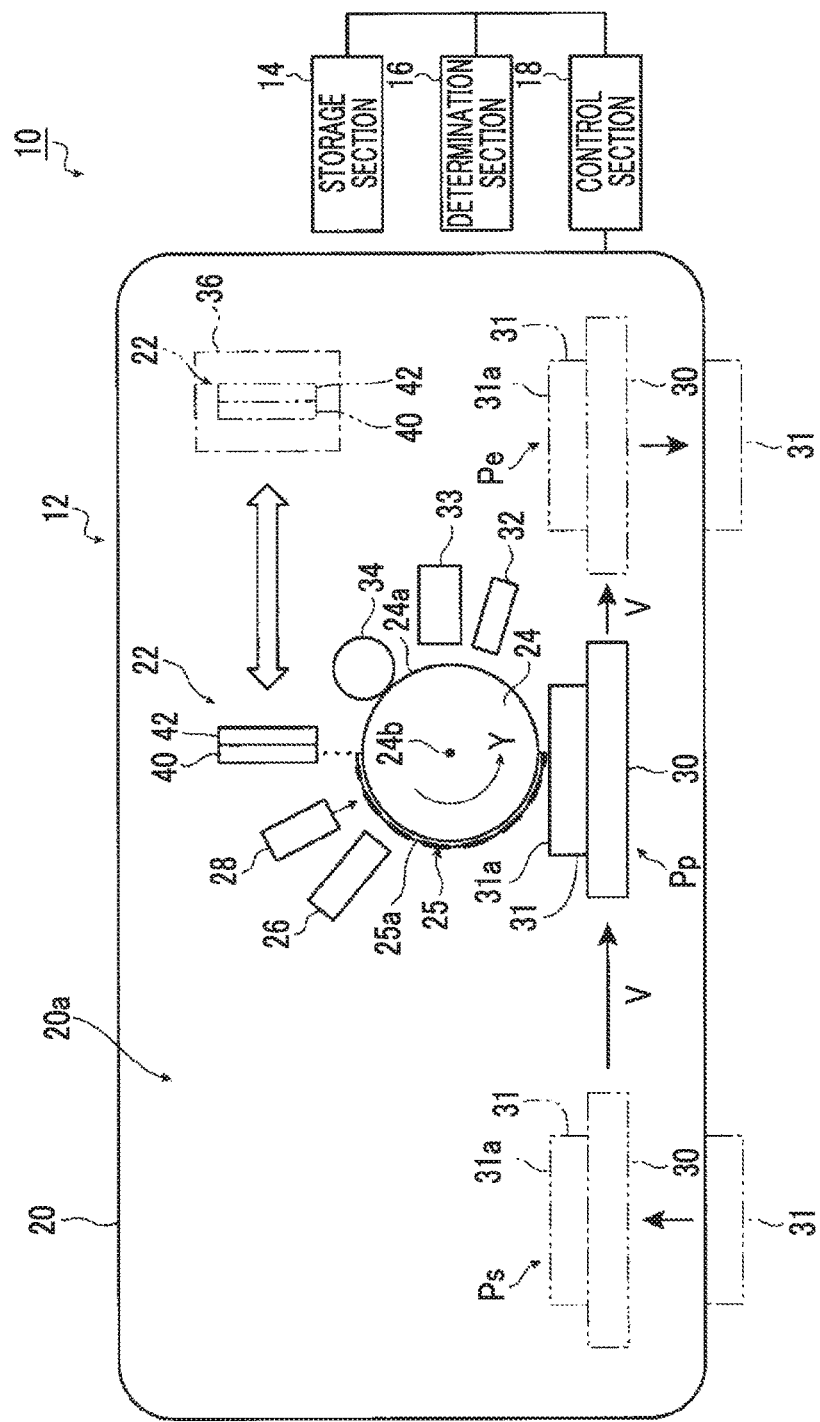
FIG. 1 is a schematic diagram showing a printing apparatus of an embodiment of the invention.

FIG. 1 is a schematic diagram showing a printing apparatus of an embodiment of the invention.

As shown in FIG. 1, the printing apparatus 10 includes a printing apparatus body 12, a storage section 14, a determination section 16, and a control section 18.

The printing apparatus body 12 is to form a predetermined pattern on a substrate 31 by a printing method. The printing apparatus body 12 will be described in detail below.

The storage section 14 is to store various kinds of information used in the printing apparatus 10. Information about a reference shape, which serves as a reference of a surface 25a of a printing plate 25 on which ink has been applied to a specific pattern, is stored in the storage section 14.

The information about the reference shape is, for example, image data representing an ideal state when ink is applied to a pattern area of the printing plate 25. Further, in a case in which ink is applied to the pattern area of the printing plate 25 multiple times, the information about the reference shape is image data representing an ideal state of each of the multiple times. For example, in a case in which ink is ejected to the pattern area by an ink jet method, dots are formed, and ink is applied to the pattern area, image data, which represents the ideal arrangement of dots formed by the ejection of ink of each time, is the above-mentioned information about the reference shape.

Further, image data, which represents the ideal state of the surface 25a of the printing plate 25 from which ink has been transferred, is also included in the information about the reference shape.

Furthermore, the pattern data of a pattern to be printed is stored in the storage section 14, but this pattern data is appropriately input from the outside. A method of inputting the information about the reference shape and the pattern data to the storage section 14 is not particularly limited. Various interfaces are provided in the storage section 14, and the information about the reference shape and the pattern data can be input to the storage section 14 through a storage medium and a wired or wireless network.

The determination section 16 compares the information, which is obtained by a plate surface observation unit 26 of the printing apparatus body 12 to be described below, about the surface 25a of the printing plate 25 on which ink has been applied to a specific pattern with the information, which is stored in the storage section 14, about a reference shape that serves as a reference of the surface 25a of the printing plate 25 on which ink has been applied to a specific pattern; and determines whether or not the ink is present in a predetermined range of the reference shape. The determination section 16 is to output determination information, which corresponds to a determination result, to the control section 18.

Further, in a case in which ink deviates from the predetermined range, the determination section 16 is to also specify a position at which ink deviates, and the like. For example, in a case in which ink is applied to a pattern area so as to protrude from the pattern area, the determination section 16 specifies a portion at which the ink protrudes. Furthermore, in a case in which ink is applied to a pattern area by an ink jet method, the determination section 16 can specify deviations in the positions of dots formed by ink, areas in which the dots is not present, and the like. Accordingly, the control section 18 adjusts the amount of ink, which is to be ejected, and the like in accordance with a specified position as described below.

The control section 18 is connected to the printing apparatus body 12, the storage section 14, and the determination section 16, and is to control the respective elements of the printing apparatus body 12, the storage section 14, and the determination section 16.

Further, the control section 18 controls the respective sections in accordance with the determination result of the determination section 16. For example, in a case in which the determination section 16 determines that ink goes over the predetermined range of the reference shape and a determination signal representing that ink goes over the predetermined range of the reference shape is output to the control section 18, the control section 18 restores the pattern of the surface of the plate by a restoration section 28 to be described below.

Next, the printing apparatus body 12 will be described.

The respective elements of the printing apparatus body 12 are provided on the inside 20a of a casing 20 so that printing is performed in a clean atmosphere. Filters (not shown) and air-conditioning facilities (not shown) are provided so that predetermined cleanliness is made on the inside 20a of the casing 20.

The printing apparatus body 12 includes an image recording section 22, a plate cylinder 24, a plate surface observation unit 26, a restoration section 28, a stage 30, a drying unit 32, an ionizer 33, a cleaning unit 34, and a maintenance section 36.

The image recording section 22, the restoration section 28, the plate surface observation unit 26, the drying unit 32, the ionizer 33, and the cleaning unit 34 are provided so as to surround the surface 24a of the plate cylinder 24. The cleaning unit 34 is provided so as to be in contact with the surface 24a of the plate cylinder 24.

A substrate 31 is disposed on the stage 30, and the stage 30 is disposed so that the printing plate 25 and a surface 31a of the substrate 31 come into contact with each other when the plate cylinder 24 is rotated in a state in which the stage 30 is positioned at a printing position Pp below the plate cylinder 24. Accordingly, ink, which is applied to the surface 25a of the printing plate 25 in the shape of a predetermined pattern, is transferred to the surface 31a of the substrate 31.

The ink is fired on the substrate 31, which has been subjected to printing, by, for example, heat, light, or the like according to the characteristics of the ink. Publicly known means used in the firing of ink, which is performed using heat or light, can be appropriately used. The firing of ink on the substrate 31 may be performed on the inside 20a of the casing 20 and may be performed on the outside of the casing 20.

Ink has been applied to the pattern area of the printing plate 25 provided on the plate cylinder 24 in the printing apparatus 10, but the application of ink may be completed at one time and ink may be applied multiple times. In a case in which ink is applied multiple times, the plate cylinder 24 is rotated by the number of times of the application of ink. For example, in a case in which ink is applied four times, the plate cylinder 24 is rotated four times. The application of ink is referred to as "inking". Further, the application of ink of one time of the multiple times is also referred to as "scanning".

The respective elements of the printing apparatus body 12 will be described below.

The image recording section 22 is to apply ink to the surface 25a of the printing plate 25, and ink is applied to the surface 25a in a predetermined pattern by the image recording section 22. An image recording method of the image recording section 22 is not particularly limited. For example, an ink jet method is used as the image recording method.

The plate cylinder 24 is rotatable about a rotating shaft 24b in a Y direction. Further, the plate cylinder 24 is to transfer the ink of the surface 25a of the printing plate 25, which is applied in the shape of a predetermined pattern, to the surface 31a of the substrate 31 by being rotated in a state in which the plate cylinder 24 holds the printing plate 25.

For example, a motor (not shown), which rotates the plate cylinder 24, is provided on the rotating shaft 24b through a gear (not shown) and the like. The motor is controlled by the control section 18. Further, a rotary encoder (not shown), which detects rotation and a rotation angle, is provided on the rotating shaft 24b. Since the rotary encoder is connected to the control section 18, the rotation angle of the plate cylinder 24 is detected by the control section 18.

The substrate 31 to which ink is to be transferred is not particularly limited. Film substrates, such as polyethylene naphthalate (PEN), polyethylene terephthalate (PET), and polycarbonate (PC); a glass epoxy substrate; a ceramic substrate; and a glass substrate can be used as the substrate. In regard to a method of transferring ink, in the case of a rigid substrate, such as a glass substrate, it is possible to transfer ink to the surface 31a of the substrate 31 by fixing the substrate 31 to the stage 30 and making the substrate 31 come into close contact with the plate cylinder 24 as described above.

In a case in which a film is used as the printing plate 25, an impression cylinder may be used to fix the film to the impression cylinder and to make the film come into close contact with the plate cylinder 24 so that ink is transferred.

The plate surface observation unit 26 is disposed on the downstream side of the image recording section 22 in the Y direction of the plate cylinder 24. The plate surface observation unit 26 is to acquire information about the surface 25a of the printing plate 25 to which ink has been applied. Further, the plate surface observation unit 26 is to also acquire information about the surface 25a of the printing plate 25 from which ink has been transferred to the substrate 31.

As long as the plate surface observation unit 26 can acquire information about the surface 25a of the printing plate 25 obtained before and after the transfer of ink, the structure of the plate surface observation unit 26 is not particularly limited. Since the printing plate 25 often has a rectangular shape, it is preferable that a line sensor and a linear illumination are used as the plate surface observation unit 26. In this case, plate surface-imaging data is obtained as the information about the surface 25a. This plate surface-imaging data is compared with the information about the reference shape and is determined by the determination section 16 as described above.

For example, a monochrome CMOS (complementary metal-oxide semiconductor) camera or a monochrome CCD (charge-coupled device) camera having about one million pixels or more can be used as the line sensor. Since the shadows of structures as ejected ink droplets are observed, a color CMOS camera or a color CCD camera does not need to be used. Furthermore, lenses, various filters, and the like may be provided in front of the line sensor. For example, a unit in which LEDs (light-emitting diodes) are arranged linearly can be used as the linear illumination.

Since the plate surface observation unit 26 is connected to the control section 18, a timing at which the information about the surface 25a of the printing plate 25 is to be acquired by the plate surface observation unit 26 is controlled by the control section 18 and the acquired information about the surface 25a of the printing plate 25 is stored in the storage section 14.

In a case in which transparent ink, such as an insulator, is used as ink, it is difficult to identify the ink with the naked eye. However, it is possible to improve the identification of the ink, which is performed by the line sensor, through the installation of a light source and a polarization filter in front of the line sensor, illumination performed from two or more positions, or the like.

Further, since the acquisition of the information about the surface 25a of the printing plate 25 is performed at the time of each scanning, it is possible to detect a deviation in a landing position, a satellite, and the unevenness of the thickness of an ink film that is caused by a change in the number of droplets to be ejected. For example, when a relationship between the thickness of an ink film and optical characteristics is measured in advance and is stored in the storage section 14, the thickness of an ink film can be estimated through the comparison between the above-mentioned relationship and detected optical characteristics.

Further, in a case in which silver nano-ink is used as ink, silver gloss is expressed from the silver nano-ink during drying and a color or reflectivity of the silver nano-ink is changed. When an ink film is thin, the ink film is quickly dried. When an ink film is thick, the ink film is slowly dried. For this reason, when a relationship between the thickness of an ink film at a predetermined time until detection and the color of the ink film and a relationship between the thickness of an ink film and the reflectivity of the ink film are measured in advance, the thickness of the ink film can be estimated.

In the case of transparent ink, such as an insulator, the thickness of an ink film can be estimated from interference fringes. When a relationship between the thickness of an ink film and interference fringes is measured in advance, the thickness of an ink film can be estimated. In the case of crystalline ink, such as a semiconductor, a polarization filter is provided and the thickness of an ink film can also be estimated from the color of the ink film. Even in this case, the thickness of an ink film can be estimated when a relationship between the thickness of the ink film and the color of the ink film is measured in advance.

The restoration section 28 is provided between the image recording section 22 and the plate surface observation unit 26 in the Y direction of the plate cylinder 24. The restoration section 28 is to restore the surface 25a. In the restoration of the surface 25a, the ink of an area protruding from the pattern is flicked away in accordance with the determination result of the determination section 16, for example, in a case in which ink is present in a range wider than a predetermined pattern. In this case, the restoration section 28 includes, for example, a laser unit (not shown) that emits a laser beam. As long as ink can be flicked away or ink can be vaporized, the output of a laser beam is not particularly limited.

The restoration section 28 may be provided with an ink jet head or a dispenser for restoration.

In a case in which ink is present in only a range narrower than a predetermined pattern, the restoration section 28 restores the surface 25a by applying ink from, for example, the ink jet head or the dispenser for restoration.

The stage 30 is a unit on which a substrate 31 is placed and which is moved in a transport direction V to transport the substrate 31 to a predetermined position. The stage 30 is provided with a transport mechanism (not shown). Since the transport mechanism is connected to the control section 18, the transport mechanism is controlled by the control section 18 and the stage 30 is moved in the transport direction V so that the position of the stage 30 is changed.

First, the stage 30 stands by at a starting position Ps where the substrate 31 transported from the outside of the casing 20 is placed on the stage 30. After that, the stage 30 is moved to a printing position Pp below the plate cylinder 24. Then, after printing, the stage 30 is moved to an end position Pe in a state in which the substrate 31 having been subjected to printing is placed on the stage 30. After that, the substrate 31 is taken out to the outside of the casing 20. The stage 30 is moved to the starting position Ps from the end position Pe, and stands by until a substrate 31 is carried in.

The drying unit 32 is to dry the ink of the surface 25a of the printing plate 25. As long as ink can be dried, a drying method is not particularly limited. Examples of the drying method include the blowing of hot air or cold air performed by a fan, heating performed by an infrared heater, the irradiation of a high-frequency wave, the irradiation of a microwave, and the like.

The drying unit 32 does not necessarily need to be provided in a case in which the ink of the surface 25a of the printing plate 25 can be dried by natural drying.

The ionizer 33 is to eliminate the electricity of the surface 25a of the printing plate 25. The static electricity of the surface 25a of the printing plate 25 is eliminated by the ionizer 33, so that the adhesion of foreign materials, such as dirt or dust, to the surface 25a of the printing plate 25 is suppressed. Further, in a case in which the surface 25a of the printing plate 25 is charged with electricity, ink may bend. However, since the bending of ink can be prevented, ink-jet ejection accuracy is improved.

A static electricity eliminator can be used as the ionizer 33. For example, a corona discharge-type static electricity eliminator and an ion generation-type static electricity eliminator can be used as the ionizer 33. Furthermore, the ionizer 33 has been provided on the downstream side of the drying unit 32 in the Y direction. However, as long as the ionizer 33 can remove the static electricity of the surface 25a of the printing plate 25 before recording is performed by the image recording section 22, the position of the ionizer 33 is not particularly limited.

The cleaning unit 34 is to remove ink adhering to the plate cylinder 24 and the printing plate 25. As long as the cleaning unit 34 can remove the ink adhering to the plate cylinder 24 and the printing plate 25, the structure of the cleaning unit 34 is not particularly limited. For example, the cleaning unit 34 is adapted to push a roller against the plate cylinder 24, to transfer ink to the roller, and to wipe off the transferred ink.

The maintenance section 36 checks whether or not the ejection characteristics of the image recording section 22 and the like exhibit predetermined performance. The maintenance section 36 is to wipe nozzles so that predetermined performance is exhibited. The maintenance section 36 is provided at a position away from the plate cylinder 24. The image recording section 22 is transported to the maintenance section 36 through, for example, a guide rail (not shown). The maintenance section 36 will be described in detail below.

The image recording section 22 will be described in detail below.

Figure 2:
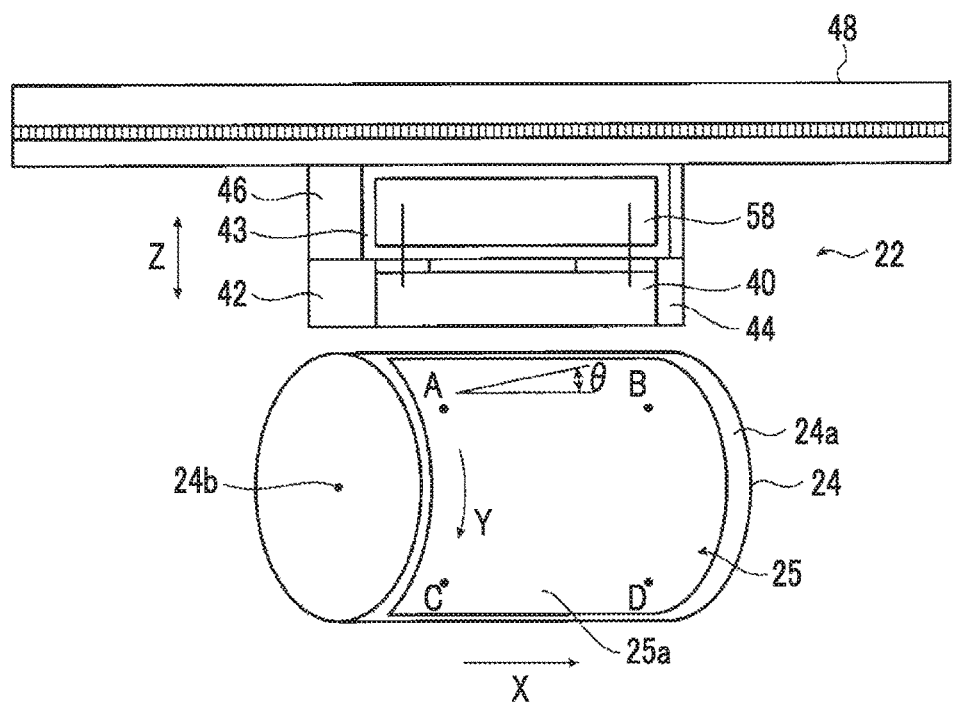
FIG. 2 is a schematic diagram showing an image recording section of the printing apparatus of the embodiment of the invention.

FIG. 2 is a schematic diagram showing the image recording section of the printing apparatus of the embodiment of the invention.

An example in which an ink jet method is used in the image recording section 22 will be described.

As shown in FIG. 2, the image recording section 22 includes an ink jet head 40, an alignment camera 42, and a laser displacement meter 44, and the ink jet head 40, the alignment camera 42, and the laser displacement meter 44 are provided in a carriage 46. The carriage 46 can be moved in the direction of the rotating shaft 24b of the plate cylinder 24, that is, an X direction by a linear motor 48, and the ink jet head 40 can be moved in the X direction by the carriage 46.

The ink jet head 40 is provided with an ejection control unit 43 that controls the ejection of ink. The ejection waveform of ink is adjusted by the ejection control unit 43. The ejection control unit 43 is connected to the control section 18. The ejection control unit 43 allows a user to adjust a discharge voltage or an ejection waveform through, for example, a user interface. Ink is ejected in a state in which the temperature of ink is adjusted as described below.

The alignment camera 42 and the laser displacement meter 44 are also connected to the control section 18. Since the carriage 46 is provided with a drive unit (not shown) moving the carriage 46 in a Z direction and the drive unit is connected to the control section 18, the movement of the carriage 46 in the Z direction is controlled by the control section 18. Here, the Z direction is a direction perpendicular to the surface 24a of the plate cylinder 24.

The alignment camera 42 is to obtain the position information of alignment marks that is used to correct the ejection position of ink, an ink ejection timing, and pattern data.

As long as the alignment camera 42 can detect alignment marks A to D, the structure of the alignment camera 42 is not particularly limited.

The alignment marks A to D are imaged by the alignment camera 42, the imaging data of the alignment marks A to D are stored in the storage section 14, and the positions of the alignment marks A to D are specified by the control section 18.

Information about an ink ejection starting position (inking starting position) in the Y direction, the expansion/contraction of the printing plate in the X direction, and an inclination angle θ of the printing plate can be obtained from the position information of the alignment marks A and B.

Information about an ink ejection starting position (inking starting position) in the X direction and the expansion/contraction of the printing plate in the Y direction can be obtained from the position information of the alignment marks A and C. For example, information about the trapezoidal distortion of the printing plate, that is, information about the trapezoidal deformation of the printing plate can be obtained from the position information of the alignment marks A to D.

An ink ejection starting position, the position of the ink jet head 40, and an ink ejection timing are corrected using the above-mentioned various kinds of information. Publicly known methods of correcting the ejection of ink droplets using an ink jet method can be used to correct all of the ink ejection starting position, the position of the ink jet head 40, and the ink ejection timing.

Further, publicly known correction methods can be used for expansion/contraction in the X direction, expansion/contraction in the Y direction, inclination, and trapezoidal correction for pattern data.

The number of the alignment marks may be at least three; and information about the expansion/contraction of the printing plate in the X direction, the inclination angle $\theta$ of the printing plate, and the expansion/contraction of the printing plate in the Y direction can be obtained. Since information about the trapezoidal distortion of the printing plate 25 can also be obtained when the number of the alignment marks is four, it is preferable that the number of the alignment marks is four. In addition, when a plurality of alignment marks are provided even inside the alignment marks A to D, non-linear correction can be performed. In this case, publicly known correction methods can also be used for correction using the alignment marks.

The laser displacement meter 44 is to measure a distance between the ink jet head 40 and the surface 25a of the printing plate 25. A distance between the alignment marks A and C in the Y direction, that is, a length AC is changed due to the swelling of the plate, which is caused by ink, or a change, which is caused by temperature, in the sum of the diameter of the plate cylinder and the thickness of the plate. Here, since the ink of the ink jet head 40 is ejected at the timing of the rotary encoder, the ink of the ink jet head 40 corresponds to a change in the length of the plate without being affected by a change in the diameter of the plate cylinder. However, when ink is transferred to the substrate 31, a distance is changed.

In order to make the length of a printing pattern, which is formed on the substrate 31, constant even though the above-mentioned length AC is changed, a change in the sum of the diameter of the plate cylinder and the thickness of the plate is measured by the laser displacement meter 44. Correction is performed on the basis of the result of the measurement.

A specific example of correction includes a method that accurately measures a change in a distance between the rotating shaft 24b of the plate cylinder 24 and the surface of the surface 25a of the printing plate 25 and changes the relative moving speeds of the plate cylinder 24 and the substrate 31 at the time of transfer on the basis of the result of the measurement.

Other than the above-mentioned specific example of correction, the specific example of correction includes, for example, a method that measures the temperature of the plate cylinder 24 or the environment and changes the relative moving speeds of the plate cylinder 24 and the substrate 31 at the time of transfer on the basis of a table, which is prepared in advance, of a relationship between temperature and the distance between the rotating shaft 24b of the plate cylinder 24 and the surface 25a of the printing plate 25.

Printing can be accurately performed by the above-mentioned specific example of correction even though the swelling of the plate or a change in the diameter of the plate cylinder occurs. It is known that the dimension of a transfer pattern in a feed direction is changed when a feed speed on the plate and a feed speed on the substrate are different from each other at the time of transfer.

As long as the laser displacement meter 44 can measure a distance between the ink jet head 40 and the surface 25a of the printing plate 25, the structure of the laser displacement meter 44 is not particularly limited.

Further, the laser displacement meter 44 can measure a change in the sum of the diameter of the plate cylinder and the thickness of the plate by measuring a distance to the surface 25a of the printing plate 25. This can be used for expansion/contraction in the Y direction. For example, when the diameter of the plate cylinder 24 or the thickness of the printing plate 25 is changed due to a temperature change, the length of the printing plate 25 between the alignment marks A and the alignment marks C is changed. A change in this length can be used for the correction of pattern data.

It is possible to improve alignment accuracy by using the alignment camera 42 and the laser displacement meter 44 as described above. The printing apparatus 10 is used to form a thin-film transistor as described below. Even though a difference of about 10 µm is present in a thin-film transistor, the characteristics of the thin-film transistor are changed. In a case in which a plurality of thin-film transistors are formed, the characteristics of the thin-film transistors vary. Accordingly, in a case in which a thin-film transistor is used in, for example, electronic paper, high performance cannot be obtained. However, a variation in characteristics can be suppressed.

Figure 3A:
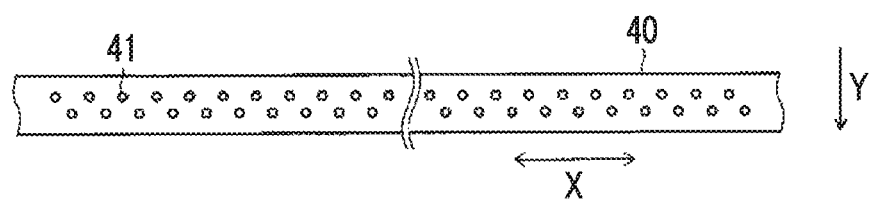
FIG. 3A is a plan view showing the arrangement of nozzles of an ink jet head.

As shown in FIG. 3A, a plurality of nozzles 41 are arranged in zigzag in the ink jet head 40 over the length of the ink jet head 40 corresponding to the entire width of the printing plate 25.

When zigzag arrangement is applied, the nozzles 41 can be densely arranged. The number of rows in which the nozzles 41 are to be arranged is not particularly limited, and may be one or two or more. Further, the nozzles 41 may be arranged in the form of a matrix.

Figure 3B:
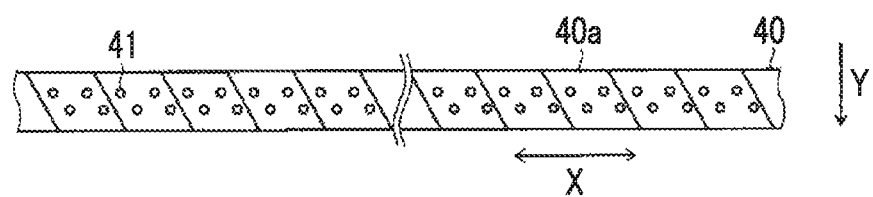
FIG. 3B is a plan view showing another example of the arrangement of nozzles of the ink jet head.

The structure of the ink jet head 40 is not particularly limited, and may have, for example, the structure shown in FIG. 3B. An ink jet head 40 shown in FIG. 3B includes a plurality of head modules 40a that are connected in the X direction. In this case, the structure of the ink jet head 40 is not limited to a structure in which the plurality of head modules 40a are connected in line, and may have a structure in which the plurality of head modules 40a are joined in zigzag.

In the ink jet head 40 shown in FIG. 3B, the ejection waveform of each head module 40a can be adjusted by the ejection control unit 43. Furthermore, if the ejection control unit 43 is provided for each head module 40a, each of the ejection control units 43 can adjust an ejection waveform.

A method of ejecting ink in the ink jet head 40 is not particularly limited. Various methods, such as a piezoelectric method of ejecting liquid using the bending deformation, the shear deformation, the longitudinal vibration, and the like of a piezoelectric element, a thermal method of ejecting ink using a film boiling phenomenon by heating liquid, which is present in a liquid chamber, with a heater, and an electrostatic method using an electrostatic force, can be used as the method of ejecting ink in the ink jet head 40.

Next, an ink supply mechanism of the printing apparatus 10 will be described.

Figure 4:
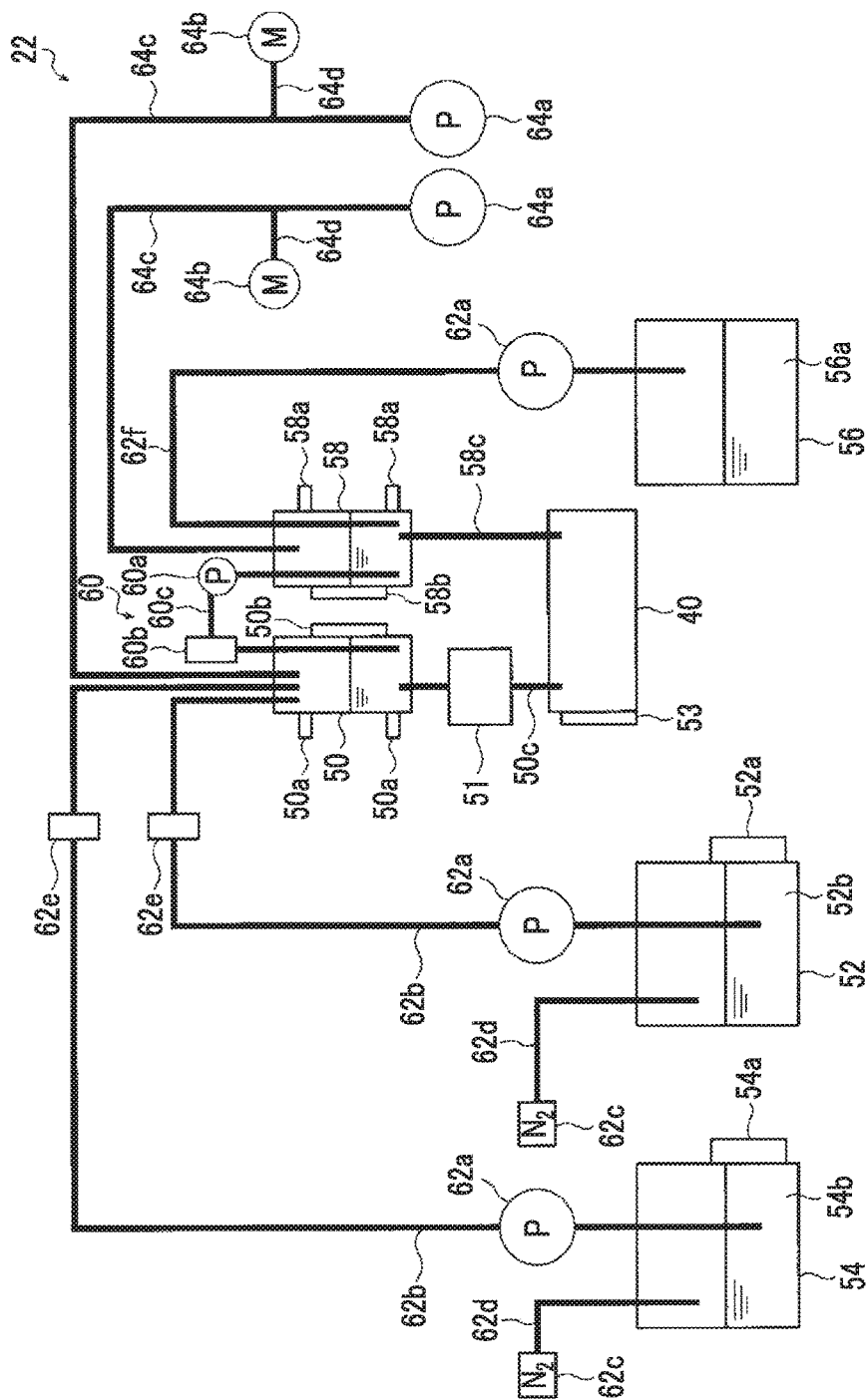
FIG. 4 is a schematic diagram showing an ink supply mechanism of the printing apparatus of the embodiment of the invention.

FIG. 4 is a schematic diagram showing an ink supply mechanism of the printing apparatus of the embodiment of the invention.

As shown in FIG. 4, in the image recording section 22, two sub-tanks 50 and 58 are connected to the ink jet head 40 through pipes 50c and 58c, respectively. The pipe 50c is provided with a deaeration unit 51. The deaeration unit 51 is to deaerate ink to be supplied to the ink jet head 40, and publicly known units can be appropriately used as the deaeration unit 51.

The sub-tank 50 is to store ink to be supplied to the ink jet head 40. The sub-tank 50 is provided with two water level sensors 50a and a temperature adjusting unit 50b.

As long as the water level sensor 50a can measure the level of ink, the structure of the water level sensor 50a is not particularly limited and publicly known sensors can be appropriately used as the water level sensor 50a.

The temperature adjusting unit 50b is to adjust the temperature of ink. Accordingly, the temperature of ink can be adjusted. It is preferable that the temperature of ink is in the range of, for example, about 15° C. to 30° C. As long as the temperature adjusting unit 50b can adjust the temperature of ink, the structure of the temperature adjusting unit 50b is not particularly limited and publicly known sensors can be appropriately used as the temperature adjusting unit 50b.

The sub-tank 58 is to store ink that is recovered from the ink jet head 40. The sub-tank 58 is provided with two water level sensors 58a and a temperature adjusting unit 58b.

Since the water level sensor 58a has the same structure as the water level sensor 50a, the detailed description of the water level sensor 58a will be omitted. Since the temperature adjusting unit 58b also has the same structure as the temperature adjusting unit 50b, the detailed description of the temperature adjusting unit 58b will be omitted.

There is a circulation unit 60 that moves the ink of the sub-tank 58 to the sub-tank 50. The circulation unit 60 includes a pipe 60c that connects the sub-tank 50 to the sub-tank 58, and a pump 60a and a filter 60b that are provided on the pipe 60c. The pump 60a is to adjust the amount of ink of the sub-tank 50 and the amount of ink of the sub-tank 58. As long as the pump 60a can move ink between the sub-tanks 50 and 58, the structure of the pump 60a is not particularly limited and publicly known pumps can be appropriately used as the pump 60a. Ink, which is moved to the sub-tank 50 from the sub-tank 58, passes through the filter 60b, and the filter 60b removes dirt and the like at this time.

Pipes 64c are inserted into the sub-tanks 50 and 58 and are provided with pumps 64a, respectively. Further, pressure sensors 64b are connected to the pipes 64c through pipes 64d, respectively. Although not shown, valves and the like are provided on the pipes 64c and 64d. Accordingly, the sub-tanks 50 and 58 are filled with nitrogen gas. Furthermore, when the amount of nitrogen gas with which the sub-tank is filled is changed, a difference is generated between the pressure of the sub-tank 50 and the pressure of the sub-tank 58. Therefore, ink can be easily circulated.

The pressure of the sub-tank 50 and the pressure of the sub-tank 58 can be measured by the pressure sensors 64b. It is possible to control the meniscus negative pressure and the amount of ink, which is to be circulated, of the ink jet head 40 by using the results of the measurement of the pressure of the pressure of the sub-tank 50 and the pressure of the sub-tank 58 that are measured by the pressure sensors 64b.

An ink tank 52 is connected to the sub-tank 50 through a pipe 62b. The pipe 62b is provided with a pump 62a and a filter 62e. The ink tank 52 is filled with ink 52b.

The ink tank 52 is provided with a temperature adjusting unit 52a. Since the temperature adjusting unit 52a has the same structure as the temperature adjusting unit 50b, the detailed description of the temperature adjusting unit 52a will be omitted.

Further, a bomb 62c, which is filled with, for example, nitrogen gas, is connected to the ink tank 52 through a pipe 62d. Accordingly, the ink tank 52 is filled with nitrogen gas.

Furthermore, a cleaning solution bottle 54 is connected to the sub-tank 50 through a pipe 62b. The pipe 62b is provided with a pump 62a and a filter 62e. The cleaning solution bottle 54 is filled with a cleaning solution 54b.

The cleaning solution bottle 54 is provided with a temperature adjusting unit 54a. Since the temperature adjusting unit 54a has the same structure as the temperature adjusting unit 50b, the detailed description of the temperature adjusting unit 54a will be omitted.

Further, a bomb 62c, which is filled with, for example, nitrogen gas, is connected to the cleaning solution bottle 54 through a pipe 62d. Accordingly, the cleaning solution bottle 54 is filled with nitrogen gas.

The temperature of ink can be adjusted by the temperature adjusting unit 52a, but it is preferable that the temperature of ink of the sub-tank 50 is higher than the temperature of ink of the ink tank 52.

A waste liquid tank 56 is connected to the sub-tank 58 through a pipe 62f. A pump 62a is connected to the pipe 62f. Accordingly, the ink 52b stored in the sub-tank 58 can be moved into the waste liquid tank 56 as waste liquid.

Nano-metal ink for ink jet can be used as the ink 52b. Specifically, Ag nano-metal ink (Ag1teH (model number), L-Ag1TeH (model number)) made of ULVAC and Au nano-metal ink (cyclododecene solvent) ink jet type can be used as the ink 52b.

Next, the printing plate 25 will be described.

Figure 5A:
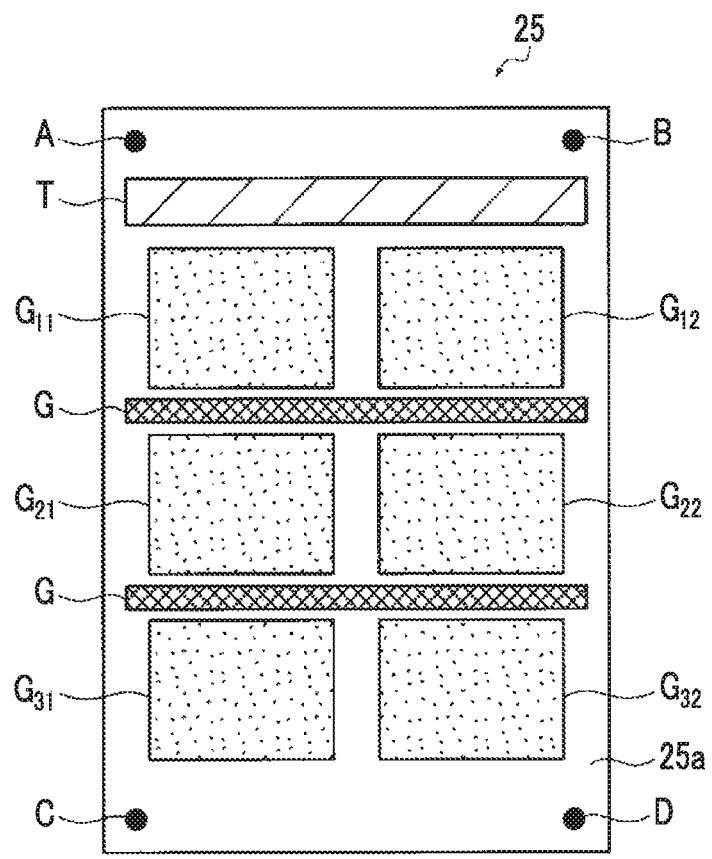
FIG. 5A is a schematic diagram showing an example of a printing plate that is used in the printing apparatus of the embodiment of the invention.
Figure 5B:
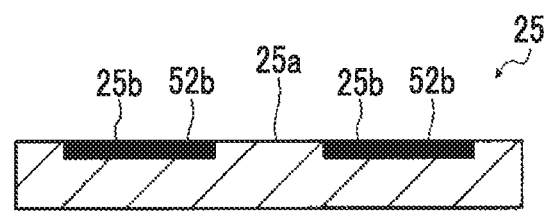
FIG. 5B is a schematic cross-sectional view showing the example of the printing plate that is used in the printing apparatus of the embodiment of the invention.

FIG. 5A is a schematic diagram showing an example of the printing plate that is used in the printing apparatus of the embodiment of the invention, and FIG. 5B is a schematic cross-sectional view showing the example of the printing plate that is used in the printing apparatus of the embodiment of the invention.

As shown in FIG. 5A, for example, the alignment marks A to D are provided at four corners on the surface 25a of the printing plate 25, respectively. An ejection confirmation area T, printing areas $G_{11}$ and $G_{12}$, a spit area G, printing areas $G_{21}$ and $G_{22}$, a spit area G, and printing areas $G_{31}$ and $G_{32}$ are formed on the surface 25a of the printing plate 25.

The ejection confirmation area T is an area to which ink is to be ejected in the shape of a test pattern by the ink jet head 40. After being evaluated, the ink of the ejection confirmation area T is removed by the cleaning unit 34 or is removed by being transferred to the substrate 31.

The spit areas G are areas to which ink is ejected through a normal ejection operation by the ink jet head 40 and which are used for the confirmation of ejection.

Since areas used for the confirmation of ejection, that is, the ejection confirmation area T and the spit areas G are provided in front of the printing areas $G_{11}$ to $G_{31}$ and $G_{12}$ to $G_{32}$, ink can be reliably ejected to the printing areas $G_{11}$ to $G_{31}$ and $G_{12}$ to $G_{32}$.

For example, recessed portions 25b are formed on the surface 25a of the printing plate 25 as shown in FIG. 5B. The ink 52b is ejected into the recessed portions 25b in the form of droplets, so that ink is applied in the shape of a pattern. The depth of the recessed portion 25b is about several μm.

The material of the printing plate 25 is not limited to a resin, metal, glass, and the like. However, when a resin plate is used as the printing plate 25, printing is easily performed on a brittle material such as glass since the printing plate 25 has elasticity and printing pressure can be lowered. Various elastomers, such as fluorosilicone rubber, butyl rubber, ethylene-propylene rubber, nitrile rubber, neoprene rubber, Hypalon rubber, and urethane rubber, can be used for the printing plate 25; and silicone rubber having high releasability, such as polydimethylsiloxane (PDMS), fluororubber, and the like are desirable. Since the transferability of ink is improved when polydimethylsiloxane (PDMS) and the like are used for the printing plate 25, the remaining of ink on the printing plate 25 after transfer is suppressed. Accordingly, continuous printing can be performed even though the printing plate 25 is not cleaned. Therefore, printing efficiency can be improved.

A plate on which recessed portions 25b are formed in a predetermined pattern is used as the printing plate 25, and the recessed portions 25b are formed by a publicly known method.

Figure 6:
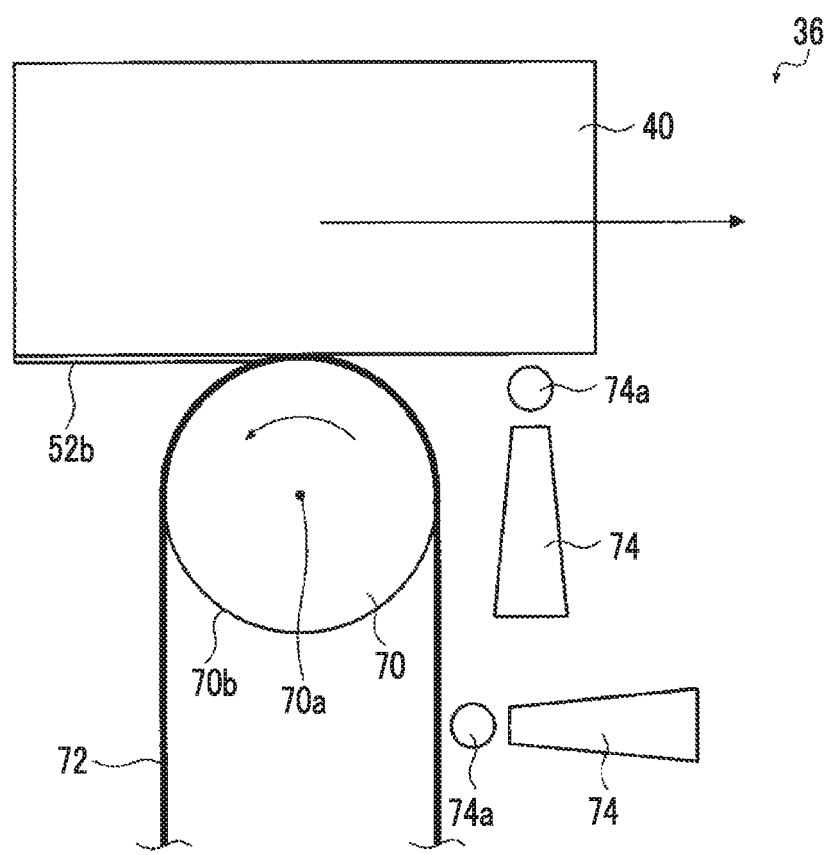
FIG. 6 is a schematic diagram showing an example of a maintenance section of the printing apparatus of the embodiment of the invention.

FIG. 6 is a schematic diagram showing an example of the maintenance section of the printing apparatus of the embodiment of the invention.

As shown in FIG. 6, a rotating roller 70 is disposed for the ink jet head 40. The rotating roller 70 includes a rotating shaft 70a and is rotated about the rotating shaft 70a. A web 72, which cleans the ink jet head 40, is wound on the peripheral surface 70b of the rotating roller 70. As long as the web 72 can remove the ink 52b of the ink jet head 40, the web 72 is not particularly limited. For example, a cleaning solution 74a is directly applied or sprayed to the ink jet head 40 by a cleaning part 74, and the web 72 comes into contact with the ink jet head 40 during the rotation of the rotating roller 70 to remove the ink 52b. Further, a cleaning solution 74a may be sprayed to the web 72 by a cleaning part 74, and the web 72 may come into contact with the ink jet head 40 during the rotation of the rotating roller 70 to remove the ink 52b.

For example, a solvent having ink solubility or a solution not containing solid of ink components is used as the cleaning solution. A hydrocarbon solvent can be used for Ag nano-metal ink (Ag1teH (model number), L-Ag1TeH (model number)) made of ULVAC and Au nano-metal ink (cyclododecene solvent) ink jet type. For example, toluene, xylene, hexane, tetradecane, and cyclododecene can be used as a hydrocarbon solvent.

For example, wiping cloth, such as SAVINA (registered trademark) manufactured by KB Seiren Ltd., TORAYSEE (registered trademark) manufactured by Toray Industries, Inc., and NANOFRONT (registered trademark) and MICROSTAR (registered trademark) manufactured by Teijin Ltd., can be used as the web 72.

Further, a member, which cleans the ink jet head 40, is not limited to the member shown in FIG. 6. For example, a structure including a rubber blade (not shown) can also be provided. Since the ink jet head 40 can be moved in the X direction by the carriage 46, the rubber blade is fixed and wipe off ink in the longitudinal direction of the ink jet head 40 by using the fact that the ink jet head 40 can be moved in the X direction by the carriage 46. Further, the ink jet head 40 may be fixed and the rubber blade may be scanned to wipe off ink. At this time, when ink is wiped off in a lateral direction orthogonal to the longitudinal direction of the ink jet head 40, there is a merit that the moving distance of the rubber blade can be made short. In addition, there is a merit that the ink having been wiped off is not likely to enter other nozzles. On the other hand, when ink is wiped off in a direction parallel to the longitudinal direction of the ink jet head 40, there is a merit that the X axis of the ink jet head 40 can be shared. Accordingly, the maintenance section may be designed in an optimum form in which the structure or cost of the apparatus is considered.

A cleaning solution may be applied to the rubber blade or the ink jet head 40 so that ink is wiped off. The pressure of the sub-tank 50 and the pressure of the sub-tank 58 at the time of the wipe of ink can be set separately from those at the time of printing. It is preferable that optimum pressure is set according to the condition of wipe, the ink jet head 40, or ink.

In a case in which a web (not shown) is used, the web is moved to wipe off ink while the ink jet head 40 is moved in, for example, the X direction. Accordingly, the surface of the web is always refreshed. The same web as the above-mentioned web 72 can be used as the web.

At least one of a method of wiping off ink after a cleaning solution is contained in a web in advance and a method of wiping off ink while applying a cleaning solution to the ink jet head 40 may be used. The pressure of the sub-tank 50 and the pressure of the sub-tank 58 at the time of the wipe of ink can be set separately from those at the time of printing. It is preferable that optimum pressure is set according to the condition of wipe, the ink jet head 40, or ink.

The maintenance section 36 can allow the ink jet head 40 to perform an operation, such as purge, spit, and drip.

Here, purge is to extrude ink from the nozzles 41 after the pressure of the sub-tank 50 is set to positive pressure in a state in which the ink jet head 40 is disposed above an ink receiver 77. The ink receiver 77 can be shared with a cap and a wipe part.

Spit is an operation for ejecting ink. Nozzle clogging and ejection bending can be improved by spit. Spit is performed at the same position as purge, but a station for spit may be provided. In this case, it is preferable that ejected ink is sucked from below not to scatter. At the time of spit, a drive voltage is made high in comparison with an ejection waveform in the ink jet head 40 at the time of printing or an exclusive waveform is used. The exclusive waveform is set so that the amount of ink droplets is large and the jetting frequency of ink is high in comparison with an ejection waveform at the time of printing.

Drip is not a recovery operation for extruding ink as strong as the above-mentioned purge and is an operation for recovering ink by dropping ink in a gentle pace. Accordingly, nozzle clogging and the ejection bending of ink can be improved by drip. Drip is also performed at the same position as purge or spit, but the pressure of the sub-tank 50 at the time of drip is set closer to positive pressure than the pressure thereof at the time of printing. However, it is preferable that the pressure of the sub-tank 50 is positive pressure higher than the atmospheric pressure and is lower than purge pressure.

Further, the maintenance section 36 may include a cap mechanism (not shown) to prevent the nozzles 41 from being dried. The cap mechanism is to fill the perimeter of the nozzles 41 with nitrogen gas after capping the nozzles 41. Furthermore, when a web or the like is soaked with a cleaning solution, and is disposed in a cap, it is also possible to further prevent the nozzles 41 from being dried.

Figure 7:
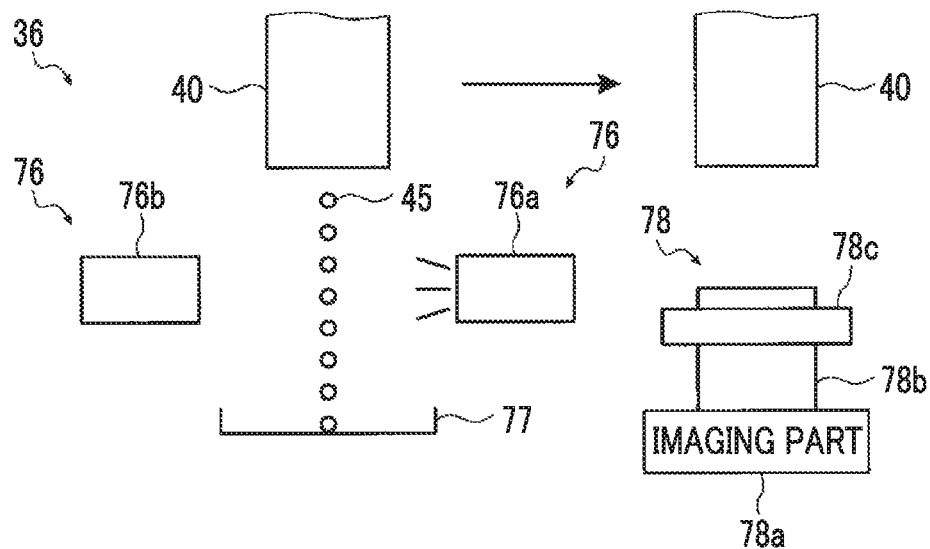
FIG. 7 is a schematic diagram showing an ejection observation unit and a nozzle observation unit of the maintenance section of the printing apparatus of the embodiment of the invention.

FIG. 7 is a schematic diagram showing an ejection observation unit and a nozzle observation unit of the maintenance section of the printing apparatus of the embodiment of the invention.

As shown in FIG. 7, the maintenance section 36 includes an ejection observation unit 76 that observes ink droplets 45 ejected from the ink jet head 40 and a nozzle observation unit 78 that observes the nozzles 41 (see FIG. 3A) of the ink jet head 40 from the surface of the ink jet head 40 on which the nozzles 41 are formed. The ink receiver 77, which receives the ink droplets 45, is disposed so as to face the ink jet head 40.

The ejection observation unit 76 includes a light source 76a and an imaging part 76b, and the light source 76a and the imaging part 76b are disposed with the ink droplets 45 interposed therebetween. A LED light source and a stroboscopic light source can be used as the light source 76a. For example, NANO PULSE LIGHT manufactured by Sugawara Seisakusho Co., Ltd. can be used as the stroboscopic light source.

For example, a camera including a camera lens can be used as the imaging part 76b. For example, a camera lens, which has an optical magnification in the range of 0.5 to 10 and a working distance of 30 mm or more, is used as the camera lens. For example, a camera, which includes a monochrome CMOS or a monochrome CCD having about one million pixels or more, is used as the camera. Since the ejection observation unit 76 observes the shadows of the ejected ink droplets 45, a color camera does not need to be used in the ejection observation unit 76.

In the nozzle observation unit 78, one end of a lens 78b is connected to an imaging part 78a and a light source 78c is provided at the other end of the lens 78b.

For example, a camera, which includes a monochrome CMOS or a monochrome CCD having about one million pixels or more, is used as the imaging part 78a, and both a color camera and a monochrome camera can be used as the imaging part 78a.

For example, a camera lens, which has an optical magnification in the range of 0.5 to 10, is used as the lens 78b. Since there is a possibility that ink adheres to the camera lens, it is preferable that a protective filter, which is easily replaced or cleaned, is provided on the camera lens.

The imaging part 78a and the lens 78b may be formed integrally with each other and may be formed separately from each other. A camera including a camera lens can be used in a case in which the imaging part 78a and the lens 78b may be formed integrally with each other.

For example, a LED light source can be used as the light source 78c, and a coaxial illumination, a ring illumination, or the like can be used as the light source 78c.

Since both the ejection observation unit 76 and the nozzle observation unit 78 are connected to the control section 18, the operations of the light sources 76a and 78c and the imaging parts 76b and 78a are controlled by the control section 18 and imaging data obtained from the imaging parts 76b and 78a are stored in the storage section 14 by the control section 18. The state of the ejection of ink from the ink jet head 40 is compared with, for example, a design value of the ejection characteristics of the ink jet head 40 by the control section 18, and the result of the comparison is stored in the storage section 14.

The printing apparatus 10 of the invention can form a gate electrode, a source electrode, and a drain electrode of a thin-film transistor used in, for example, electronic paper and the like.

Figure 8:
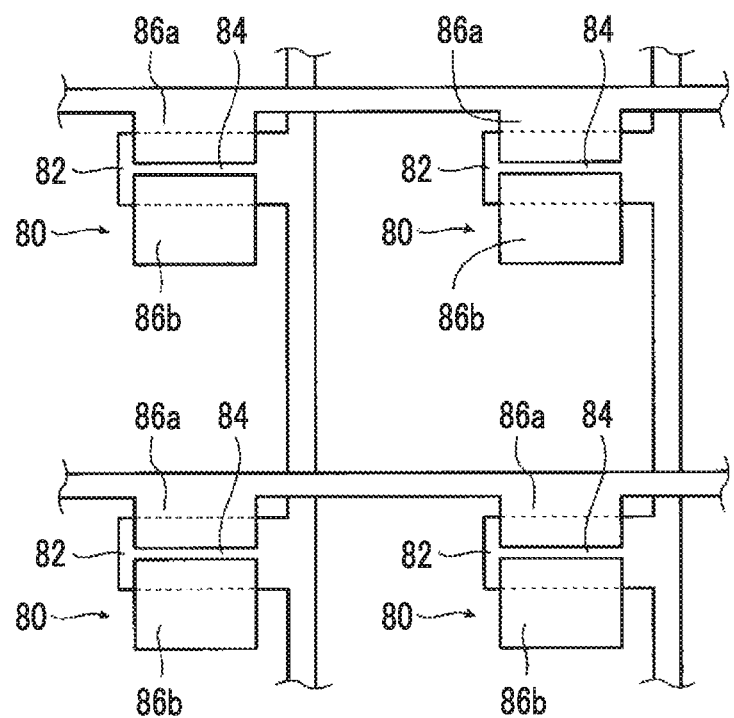
FIG. 8 is a schematic diagram showing an example of a thin-film transistor that is formed by the printing apparatus of the embodiment of the invention.

FIG. 8 is a schematic diagram showing an example of a thin-film transistor that is formed by the printing apparatus of the embodiment of the invention.

A thin-film transistor 80 (hereinafter, referred to as a TFT 80) shown in FIG. 8 includes a gate electrode 82, a gate insulating layer (not shown), a source electrode 86a, a drain electrode 86b, a semiconductor layer (not shown), and a protective layer (not shown).

The gate insulating layer (not shown) is formed in the TFT 80 so as to cover the gate electrode 82. The source electrode 86a and the drain electrode 86b are formed on the gate insulating layer with a predetermined gap, which serves as a channel area 84, interposed therebetween. A semiconductor layer (not shown), which functions as an active layer, is formed on the channel area 84. The protective layer (not shown), which covers the semiconductor layer, the source electrode 86a, and the drain electrode 86b, is formed.

A method of correcting a pattern will be described below. A case in which a pattern is formed by the ejection of ink droplets of four times will be described by way of example.

FIG. 9A is a schematic diagram showing a state in which ink has been applied to a pattern, FIG. 9B is a schematic diagram showing a state in which first ink has been applied to the pattern, and FIG. 9C is a schematic diagram showing a state in which second ink has been applied to the pattern.

For example, a case in which a pattern 90 shown in FIG. 9A is formed by the ejection of ink droplets of four times is ideally shown in FIG. 9A. Reference numeral 92a denotes dots formed by first ink droplets, reference numeral 92b denotes dots formed by second ink droplets, reference numeral 92c denotes dots formed by third ink droplets, and reference numeral 92d denotes dots formed by fourth ink droplets.

After the ejection of the first ink droplets, the plate surface observation unit 26 images the surface of the plate and obtains plate surface-imaging data and the determination section 16 performs determination. As a result, in a case in which ink is not ejected due to the malfunction of the ink jet head 40 or the like and a deficient portion 93 is present among the dots 92a formed by first ink droplets as shown in FIG. 9B, the amount of ink to be ejected from the ink jet head 40 is changed by the control section 18 at the time of the ejection of the second ink droplets. Accordingly, ink droplets are ejected at the time of the second ejection of ink so that dots 94 having a large size are formed to surround the deficient portion 93 as shown in FIG. 9C. Therefore, an appropriate pattern 90 can be formed.

Next, another example of the method of correcting a pattern will be described.

Figure 10A:
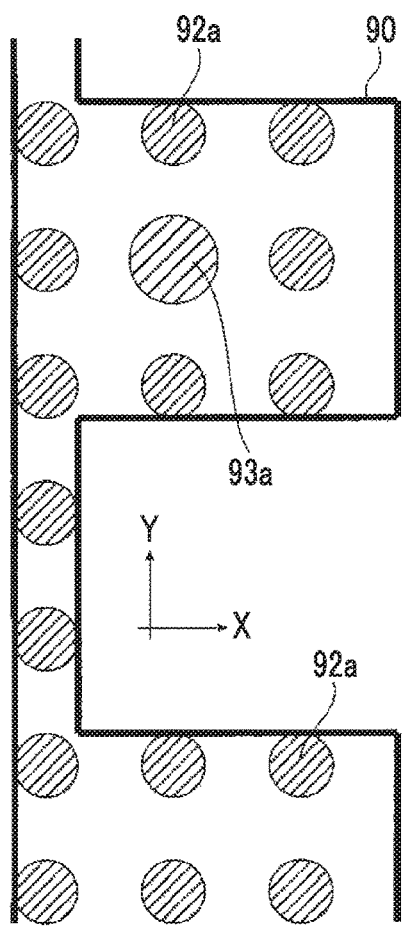
FIG. 10A is a schematic diagram showing a state in which first ink has been applied to a pattern.
Figure 10B:
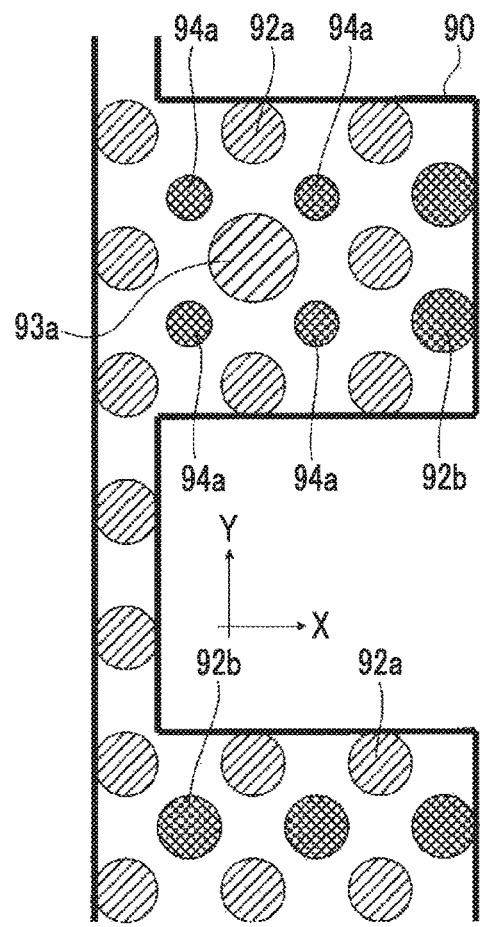
FIG. 10B is a schematic diagram showing a state in which second ink has been applied to the pattern.

FIG. 10A is a schematic diagram showing a state in which ink has been applied to a pattern, and FIG. 10B is a schematic diagram showing a state in which first ink has been applied to the pattern.

The same components of FIGS. 10A and 10B as the components of FIG. 9A are denoted by the same reference numerals as those of FIG. 9A, and the detailed description thereof will be omitted.

After the ejection of the first ink droplets, the plate surface observation unit 26 images the surface of the plate and obtains plate surface-imaging data and the determination section 16 performs determination. As a result, in a case in which a large dot 93a is formed as shown in FIG. 10A due to the malfunction of the ink jet head 40 or the like among the dots 92a formed by first ink droplets, the amount of ink to be ejected from the ink jet head 40 is changed by the control section 18 at the time of the second ejection of ink droplets. Accordingly, ink droplets are ejected at the time of the ejection of the next second ink droplets so that dots 94*a* having a small size are formed to surround the large dot 93*a* as shown in FIG. 10B. Therefore, an appropriate pattern 90 can be formed.

Next, another example of the method of correcting a pattern will be described.

Figure 11A:
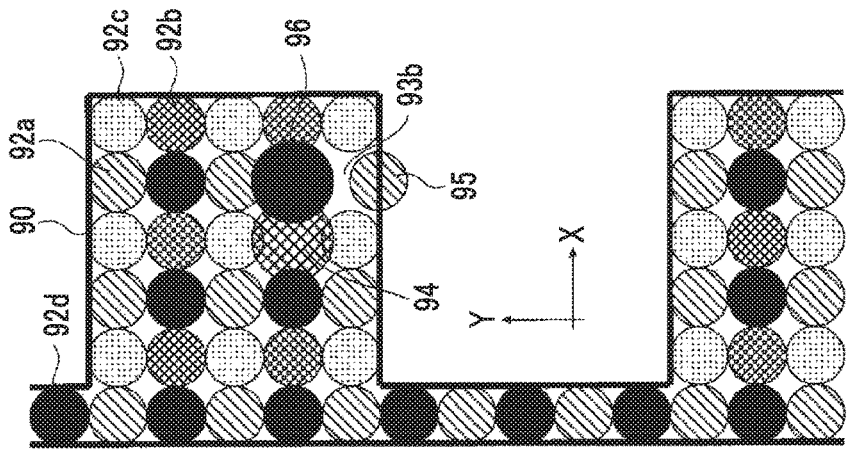
FIG. 11A is a schematic diagram showing a state in which ink has been applied to a pattern.
Figure 11B:
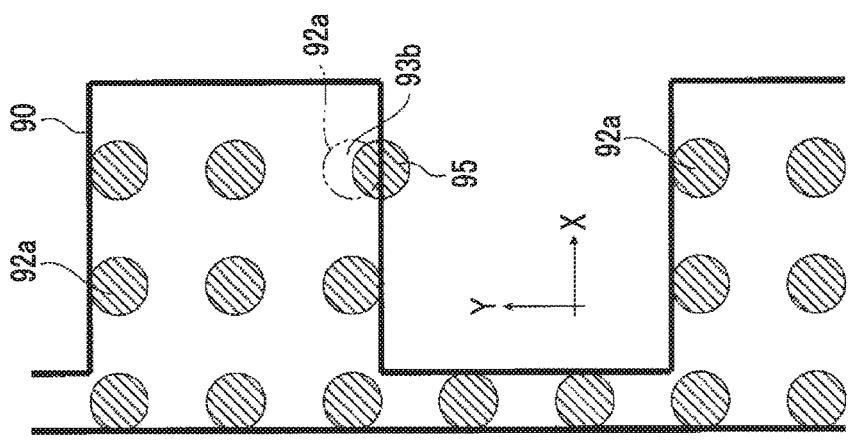
FIG. 11B is a schematic diagram showing a state in which first ink has been applied to the pattern.
Figure 11C:
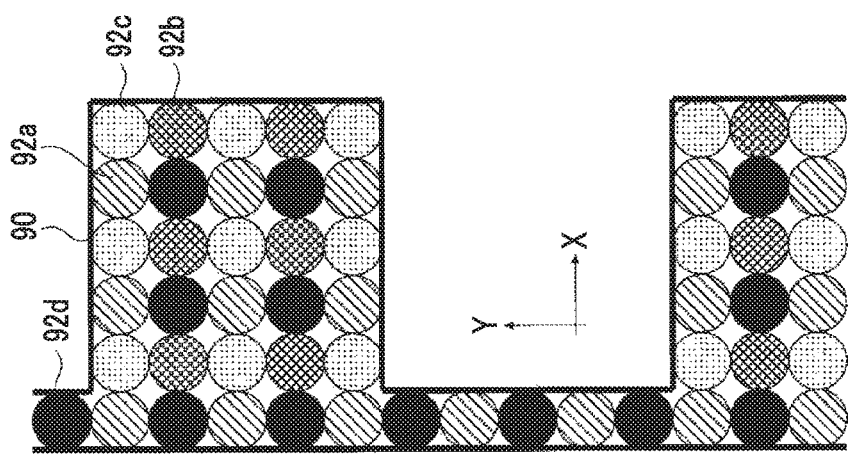
FIG. 11C is a schematic diagram showing a state in which fourth ink has been applied to the pattern.

FIG. 11A is a schematic diagram showing a state in which ink has been applied to a pattern, FIG. 11B is a schematic diagram showing a state in which first ink has been applied to the pattern, and FIG. 11C is a schematic diagram showing a state in which fourth ink has been applied to the pattern.

For example, a case in which a pattern 90 shown in FIG. 11A is formed by the ejection of ink droplets of four times is ideally shown in FIG. 11A. The same components of FIGS. 11A to 11C as the components of FIG. 9A are denoted by the same reference numerals as those of FIG. 9A, and the detailed description thereof will be omitted.

After the ejection of the first ink droplets, the plate surface observation unit 26 images the surface of the plate and obtains plate surface-imaging data and the determination section 16 performs determination. As a result, in a case in which the landing position of a first ink droplet deviates and a dot 95 is formed so as to protrude from the pattern 90 as shown in FIG. 11B due to the malfunction of the ink jet head 40 or the like, a deficient portion 93*b* is detected as much as the dot 95 deviates from the position of an original dot 92*a*.

The amount of ink to be ejected from the ink jet head 40 is changed by the control section 18 at the time of the ejection of the second or later ink droplets so that the deficient portion 93*b* is reduced in size. As shown in FIG. 11C, for example, the size of a dot 94, which is obtained at the second time, and the size of a dot 96, which is obtained at the fourth time, are made large, the deficient portion 93*b* is made small, and a portion of the dot 95 protruding from the pattern 90 is irradiated with a laser beam of the restoration section 28 so that ink is vaporized. Accordingly, an appropriate pattern 90 can be formed.

Next, another example of the method of correcting a pattern will be described.

Figure 12C:
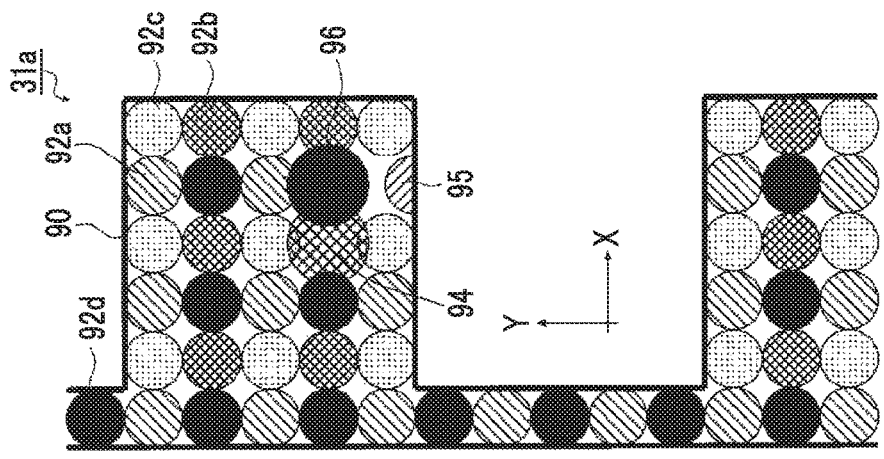
FIG. 12C is a schematic diagram showing the substrate to which ink has been transferred.
Figure 12B:
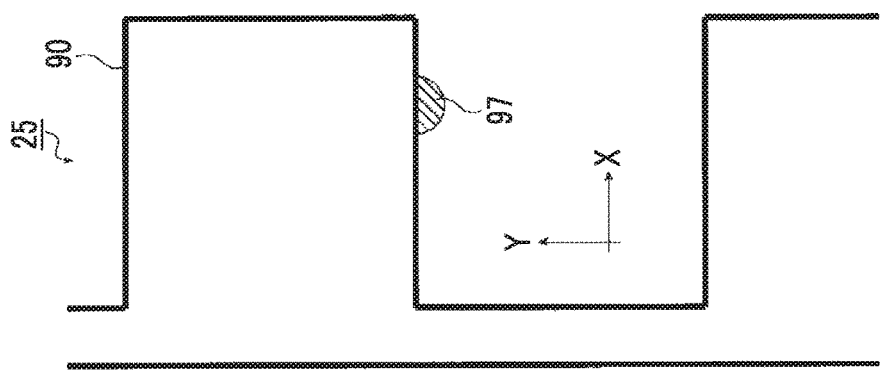
FIG. 12B is a schematic diagram showing the surface of the plate from which ink has been transferred to a substrate.
Figure 12A:
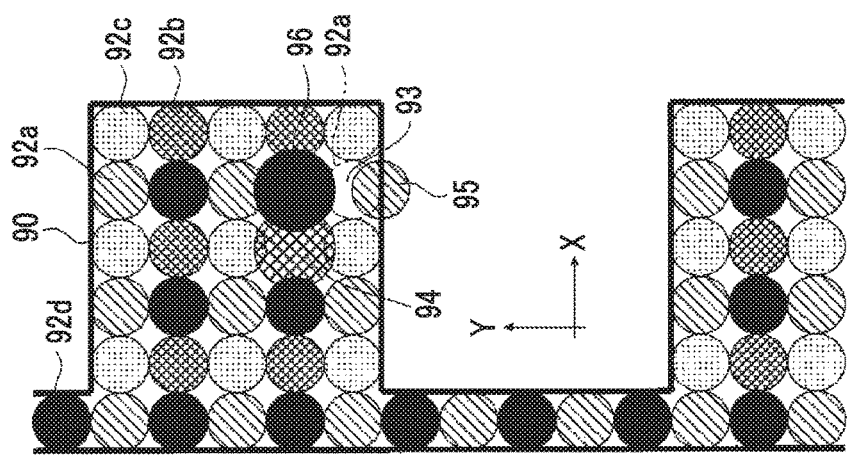
FIG. 12A is a schematic diagram showing a state in which fourth ink has been applied to a pattern.

FIG. 12A is a schematic diagram showing a state in which fourth ink has been applied to a pattern, FIG. 12B is a schematic diagram showing the surface of the plate from which ink has been transferred to a substrate, and FIG. 12C is a schematic diagram showing the substrate to which ink has been transferred.

The same components of FIGS. 12A to 12C as the components of FIG. 9A are denoted by the same reference numerals as those of FIG. 9A, and the detailed description thereof will be omitted. FIG. 12A is the same as FIG. 11C.

As shown in FIG. 12A, various dots are formed in a pattern 90 by ink droplets, and the transferability of an area of the printing plate 25 other than the pattern 90 is poor when a dot 95, which is formed so as to protrude from the pattern 90, is transferred to a substrate 31. Accordingly, a portion 97 protruding from the pattern 90 remains on the printing plate 25 as shown in FIG. 12B. On the other hand, the protruding portion 97 is not transferred to the surface 31*a* of the substrate 31 to which ink has been transferred and various dots formed in the pattern 90 are transferred to the surface 31*a* as shown in FIG. 12C.

When the plate surface observation unit 26 images the surface of the printing plate 25 from which ink has been transferred and obtains plate surface-imaging data and the determination section 16 performs determination, a protruding portion 97 is detected. When the next pattern is formed, the protruding portion 97 is removed by the restoration section 28. Accordingly, it is possible to form a pattern on the printing plate 25 with high accuracy and to eventually improve printing accuracy.

Next, another example of the method of correcting a pattern will be described.

FIG. 13A is a schematic diagram showing a state in which fourth ink has been applied to a pattern, and FIG. 13B is a schematic diagram showing a state in which first ink has been applied to the pattern.

The same components of FIGS. 13A and 13B as the components of FIG. 9A are denoted by the same reference numerals as those of FIG. 9A, and the detailed description thereof will be omitted.

Even though a dot 98, which is formed with a deviation in the landing position of a first ink droplet, is present as shown in FIG. 13A in a state in which fourth ink has been applied, a portion 99 of the dot 98 overlapping a dot 92*c* may be detected as unevenness in the thickness of an ink film but it is difficult for the portion 99 to be detected as a deviation in a landing position.

For this reason, it is possible to detect a deviation in a landing position by detecting the positions of the dots that are formed by ink droplets at every time.

For example, the plate surface observation unit 26 images the surface of the plate and obtains plate surface-imaging data after the application of first ink and before the application of second ink as shown in FIG. 13B and the determination section 16 performs determination. As a result, when the position of a dot 92*a* is detected, the dot 98, of which the landing position deviates from the set position of the dot 92*a*, is detected in the ejection of first ink. Accordingly, since the amount of ink to be ejected, ink-ejection density, and the like at the next time or later are adjusted by the control section 18, an appropriate pattern 90 can be formed.

The printing apparatus 10 is provided with the plate surface observation unit 26 and the determination section 16, can image the surface 25*a* of the printing plate 25 to which ink has been applied and obtains plate surface-imaging data by the plate surface observation unit 26, and can determine whether or not the application of ink is appropriate by the determination section 16. Since it is possible to perform a check, which corresponds to not a direct printing result but a printing result obtained from an actual substrate, by performing a method of applying ink at the next time or later, the restoration of the surface of a plate, and the like in accordance with the determination result of the determination section 16, the reliability of a check is improved. Accordingly, printing accuracy can be improved. Moreover, the substrate 31 is also not wasted for printing confirmation. In addition, since complicated structures, such as check rollers, are not necessary, the cost of the apparatus can also be reduced.

Further, since doctoring is not necessary, the scumming of the surface 25*a* of the printing plate 25 caused by doctoring is prevented and the durability of the printing plate 25 can also be improved.

Next, a printing method of this embodiment will be described using the printing apparatus 10.

FIG. 14 is a schematic diagram illustrating the printing method of the embodiment of the invention.

As described above, the plate cylinder 24 is rotated multiple times and ink is applied to the pattern area at the time of each rotation. In FIG. 14, a distance represents the rotation angle of the plate cylinder 24 and a distance of 0 represents the initial position of the printing plate 25.

Further, in FIG. 14, reference numeral 100 denotes a timing at which ink is to be ejected, reference numeral 102 denotes an interval where ink is dried, and reference numeral 104 denotes an interval where ink is transferred to a substrate 31. Furthermore, reference numeral 106 denotes the starting position of the printing of the printing plate 25 in a case in which printing is performed multiple times.

In the printing apparatus 10, a specific pattern is printed on the substrate 31 on the basis of the pattern data of a pattern to be printed.

In the example shown in FIG. 14, the plate cylinder 24 is rotated four times and ink droplets are ejected at the time of each rotation. Whenever ink droplets are ejected, the plate surface observation unit 26 acquires information about the surface 25a of the printing plate 25, the determination section 16 performs determination, and the control section 18 adjusts the amount of ink to be ejected and ink-ejection density on the basis of the determination result of the determination section 16 and ejects the next ink droplets. In this case, in a case in which there is a deficient portion in the recessed portion of the printing plate 25, the amount of ink to be ejected around the deficient portion is increased so that dots to be formed are increased in size. In addition, the number of ink droplets to be ejected is increased to be larger than a predetermined number so that ink droplet-ejection density is increased.

In contrast, in a case in which a large dot is formed in the recessed portion of the printing plate 25 when ink droplets are previously ejected, the amount of ink to be ejected is reduced so that dots to be formed are reduced in size. In addition, the number of ink droplets to be ejected is reduced to be smaller than a predetermined number so that ink droplet-ejection density is reduced.

Further, in a case in which the ink jet head 40 includes redundant nozzles, redundant nozzles can also be used.

For example, in the case of pattern data having 2400 dpi, the application of ink to a pattern area (inking) can be completed by four times of the scanning of a pattern having 1200 dpi in each of the X direction and the Y direction or four times of the scanning of a pattern having 600 dpi in the X direction and 2400 dpi in the Y direction.

Further, for example, in the case of a pattern having 1200 dpi in each of the X direction and the Y direction, a distance (minimum value) between adjacent pixels of one nozzle is also 21.2 µm and the request of an ejection frequency is low but the number of nozzles twice as large as the number of nozzles in the case of a pattern having 600 dpi in the X direction is necessary. Since a distance (minimum value) between adjacent pixels in the X direction is also 21.2 µm, there is a concern about the influence of landing interference in the X direction.

On the other hand, in the case of a pattern having 600 dpi in the X direction and 2400 dpi in the Y direction, the number of nozzles is a half of the number of nozzles in the case of the above-mentioned pattern having 1200 dpi in the X direction and a distance (minimum value) between adjacent pixels in the X direction is 42.3 µm. For this reason, the influence of landing interference in the X direction is reduced. However, since a distance (minimum value) between adjacent pixels in the Y direction is 10.6 µm, the influence of landing interference in the X direction is reduced and high-frequency wave ejection twice as high as high-frequency wave ejection in the case of the pattern having 1200 dpi in each of the X direction and the Y direction is necessary.

Next, the printing method of the printing apparatus 10 of this embodiment will be more specifically described.

FIG. 15 is a flow chart illustrating the printing method of the embodiment of the invention.

First, ink is supplied to the ink tank (Step S10). In Step S10, ink is sent to the sub-tank from the ink tank first. Then, ink is supplied to the ink jet head 40 from the sub-tank.

When ink is supplied, a cleaning solution is substituted with ink. After the cleaning solution is discharged from the ink jet head 40 by nitrogen gas, ink can be supplied. However, nitrogen gas is likely to be entrained. For this reason, it is preferable that a cleaning solution is substituted with ink.

The confirmation of ejection is performed in a state in which a cleaning solution is supplied to the ink jet head 40. In a case in which the result of the confirmation of ejection is not good when the confirmation of ejection is performed, ejection recovery is performed using the maintenance section 36. In a case in which recovery cannot be performed, the ink jet head 40 is replaced as necessary.

When a cleaning solution is substituted with ink, a cleaning solution of, for example, the sub-tank 50 is reduced to a lower limit. After that, ink is supplied to the sub-tank 50 and the cleaning solution, which is present in the ink jet head 40, is made to flow to the outside by ink. Then, the ink of the sub-tank 50 is reduced to a lower limit. Making the cleaning solution, which is present in the ink jet head 40, flow to the outside by ink and reducing the ink of the sub-tank 50 to a lower limit are repeatedly performed to substitute the cleaning solution with ink.

Next, alignment is performed (Step S12).

In this case, the position of the ink jet head 40 and the position of the plate are aligned with each other. First, the alignment marks A to C are read by the alignment camera 42 and the positions of the alignment marks A to C are detected.

After that, an absolute distance in the X direction is obtained. In this case, the absolute distance is calculated from the position of the carriage 46 (the reading of a linear scale), for example, when the alignment marks A and B are positioned at the same position in the X direction of the field of view of the alignment camera 42.

Next, an absolute distance in the Y direction is obtained. In this case, the absolute distance is calculated from the rotational position information of the plate cylinder 24 that is output from the rotary encoder when the alignment marks A and C are positioned at the same position in the Y direction of the field of view of the alignment camera 42. In regard to the Y direction, the alignment of not a distance but an angle is adjusted.

After that, the inclination of the printing plate 25 relative to the ink jet head 40 is obtained. In this case, an inclination angle θ is obtained. Not only the positions of the alignment marks A and B in the X direction but also deviations in the Y direction are measured. Deviations in the Y direction are calculated from the rotational position information of the plate cylinder 24 that is output from the rotary encoder when the alignment marks are positioned at the same position in the Y direction of the field of view of the alignment camera 42, and the inclination angle θ is calculated from the distance in the X direction and the deviations in the Y direction. Alternatively, the inclination angle θ can also be calculated from deviations in the Y direction in the field of view of the camera.

The distance in the X direction, the angle in the Y direction, and the inclination angle θ, which are obtained as described above, are stored in the storage section 14. The control section 18 obtains corrected pattern data by performing expansion/contraction processing in the X direction and the Y direction and the rotation processing of pattern data, which is based on the inclination angle θ, about the distance in the X direction, the angle in the Y direction, the inclination angle θ, and pattern data that is stored in the storage section 14 and is to be printed. In addition, the adjustment of a timing at which ink is to be ejected from the ink jet head 40 is also performed by the control section 18.

Next, the confirmation of ejection of the ink jet head 40 is performed (Step S14).

In this case, the confirmation of ejection is performed in the evaluation of a printed matter of a test pattern or the observation of ejection.

A printed matter of a test pattern is evaluated through the visual observation of a substrate, which has been subjected to printing, or the evaluation of a scanner. Further, it is also possible to perform the confirmation of ejection of the ink jet head 40 by only ejecting ink to the printing plate 25 without transferring the ink and observing the ink present on the printing plate 25 with the alignment camera 42.

The printing plate 25 is provided with the ejection confirmation area T as described above, and ink droplets are ejected to the ejection confirmation area T. The plate cylinder 24 may be provided with the ejection confirmation area T, and ink droplets may be ejected to the ejection confirmation area T.

After being evaluated, the ink of the ejection confirmation area T is removed by the cleaning unit 34 or is removed by being transferred to the substrate 31.

In a case in which the result of the confirmation of ejection deviates from a predetermined range, the maintenance section 36 performs a recovery operation or the ejection control unit 43 optimizes an ejection waveform.

Information about the landing positions of ink droplets ejected to the printing plate 25 is acquired using the alignment camera 42 together with the confirmation of ejection. The determination section 16 determines a deviation in a landing position, and adjusts the expansion/contraction, rotation, and the like of the corrected pattern data again in a case in which the landing position deviates from predetermined ranges with respect to the X direction, the Y direction, and the inclination angle θ.

Next, inking to the printing plate is performed (Step S16).

The pattern data or the corrected pattern data is sent to the ejection control unit 43; the plate cylinder 24 is rotated; ink is ejected to the printing plate 25 in a predetermined ejection waveform in accordance with a timing on the basis of the rotational position information of the plate cylinder 24 that is output from the rotary encoder at the time of the rotation of the plate cylinder 24; and inking is performed. For example, the plate cylinder 24 is rotated four times, that is, the plate cylinder 24 is scanned four times, and ink is applied to the pattern area. In this case, spit is performed at the time of each scanning. Spit is performed in the spit areas G of the printing plate 25 or a spit area (not shown) for spit that is provided on the plate cylinder 24.

Spit may be performed after a pattern is formed in a printing area, and may be performed for each printing plate. Purge, wipe, and spit may be performed per a certain number of printing plates, such as 100 printing plates by the maintenance section 36, and the confirmation of ejection may be further performed.

After inking is performed, the check of ejection is performed (Step S18).

Figure 16:
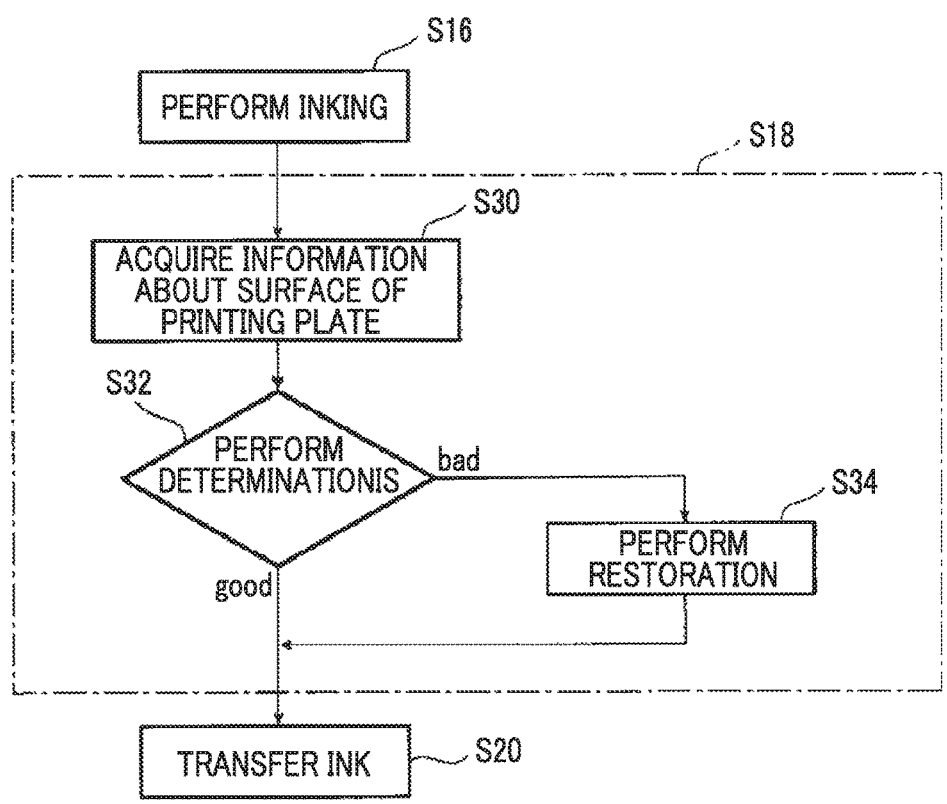
FIG. 16 is a flow chart illustrating a step of checking ejection of the printing method of the embodiment of the invention.

Here, FIG. 16 is a flow chart illustrating a step of checking ejection of the printing method of the embodiment of the invention.

As shown in FIG. 16, the plate surface observation unit 26 images dots formed on the printing plate and acquires information about the surface 25a of the printing plate 25 (Step S30), and obtains the plate surface-imaging data of the printing plate 25 that has been subjected to inking.

After that, the determination section reads out image data, which represents the ideal state of a pattern, from the storage section 14; compares the read image data with the plate surface-imaging data of the printing plate 25 having been subjected to inking; and determines whether or not the ink is present in a predetermined range (Step S32).

If ink is present in the predetermined range in Step S32, processing proceeds to a transfer step (Step S20) that is the next step.

On the other hand, if ink deviates from the predetermined range in Step S32, restoration is performed (Step S34).

In Step S34, in a case in which dots are insufficient since a void is present in the pattern, the position of the void is specified and ink is ejected again by the ink jet head 40 to form a dot.

In a case in which an ink jet head or a dispenser for restoration is provided, ink is ejected to the position of the void by the ink jet head or the dispenser for restoration to form a dot.

In a case in which a dot protrudes from the pattern, the restoration section 28 flicks an area the dot of a protruding area away. Accordingly, it is possible to restore the substrate 31 without wasting the substrate 31.

As in this embodiment, detection is performed after one time of scanning and inking needs to be performed after printing data is changed until the next scanning. For this reason, a high-speed data processing technique is required. It is preferable that the printing plate 25 includes a plurality of areas as described above. Accordingly, for example, in the three areas of the printing areas $G_{11}$ and $G_{12}$ the printing areas $G_{21}$ and $G_{22}$ and the printing areas $G_{31}$ and $G_{32}$, the detection and data processing of the printing areas $G_{11}$ and $G_{12}$ can be performed while inking is performed in the printing areas $G_{21}$ and $G_{22}$ and the printing areas $G_{31}$ and $G_{32}$. For example, information about alignment that is obtained in the printing areas $G_{11}$ and $G_{12}$, information that is obtained by the plate surface observation unit 26, and the like may be applied to the other printing areas $G_{31}$ and $G_{32}$ and the printing areas $G_{31}$ and $G_{32}$.

Next, the ink of the printing plate 25, which has been subjected to inking, is transferred to a substrate 31 (Step S20).

First, a substrate 31 is placed on the stage 30 and the stage 30 stands by at the starting position Ps. Then, the alignment of the substrate 31 is performed to position the pattern of the printing plate 25.

Next, the stage 30 is moved in the transport direction V to dispose the substrate 31 at the printing position Pp below the plate cylinder 24. Then, the plate cylinder 24 is rotated and the printing plate 25 and the surface 31a of the substrate 31 come into contact with each other, so that the ink of the printing plate 25 is transferred to the substrate 31. After transfer, the stage 30 is moved in the transport direction V to move the substrate 31 to the end position Pe from the printing position Pp below the plate cylinder 24. After that, the printing plate 25 on which a pattern is formed is moved from the stage 30 and is taken out to the outside of the casing 20.

Next, the printing plate 25 from which ink has been transferred is checked (Step S22).

Figure 17:
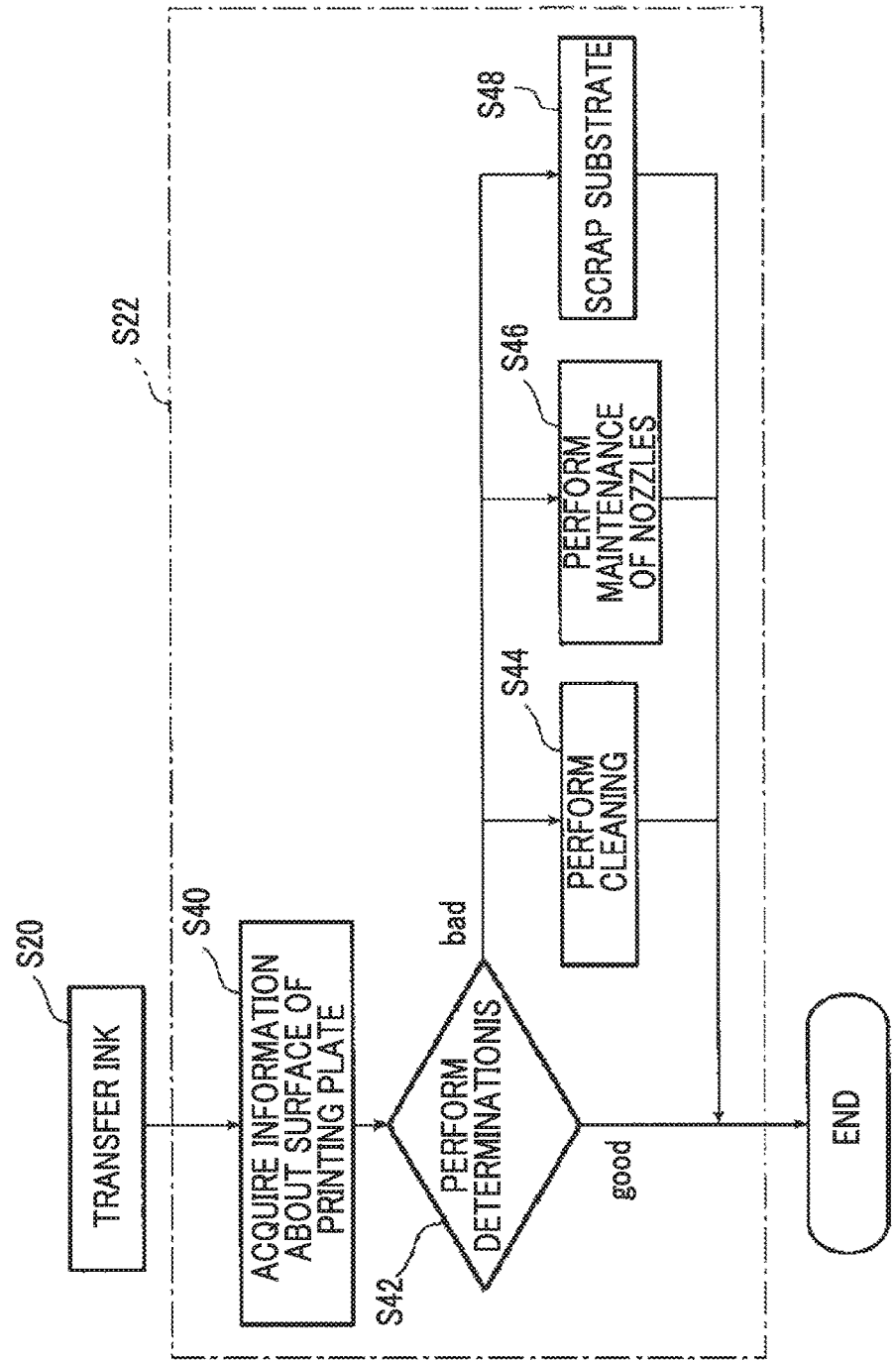
FIG. 17 is a flow chart illustrating a step of checking the plate of the printing method of the embodiment of the invention.

FIG. 17 is a flow chart illustrating a step of checking the plate of the printing method of the embodiment of the invention. A plate surface observation unit, which is used to image the printing plate 25 from which ink has been transferred, can also be provided separately from the above-mentioned plate surface observation unit 26.

In Step S22, information about the surface 25a of the printing plate 25 from which ink has been transferred is acquired by the plate surface observation unit 26 (Step S40).

The determination section compares image data, which is read out from the storage section 14 and represents the ideal state of the surface 25a of the printing plate 25 from which ink has been transferred, with the plate surface-imaging data of the surface 25a of the printing plate 25 from which ink has been transferred; and determines whether or not the ink is present in a predetermined range (Step S42). If ink is present in the predetermined range in Step S42, a printing step ends.

On the other hand, if ink is appropriately applied to the printing plate 25 in Step S42, ink does not remain on the printing plate 25 from which ink has been transferred. When ink is applied to an area wider than the pattern, ink is likely to remain on the printing plate 25 without being transferred to the substrate 31 since a protruding portion of the printing plate 25 does not have transferability. In a case in which ink remains on the printing plate 25, the determination section 16 determines that ink is not present in the predetermined range. In addition, the determination section compares the image data, which is read out from the storage section 14 and represents the ideal state of the surface 25a of the printing plate 25 from which ink has been transferred, with the plate surface-imaging data of the surface 25a having been subjected to inking four times, that is, having been subjected to scanning four times; and the plate cylinder 24 is rotated and remaining ink is removed by the cleaning unit 34 if remaining portions have the same shape (Step S44).

The determination section compares the image data, which is read out from the storage section 14 and represents the ideal state of the surface 25a of the printing plate 25 from which ink has been transferred, with the plate surface-imaging data of the surface 25a having been subjected to scanning four times; and the plate cylinder 24 is rotated and remaining ink is removed by the cleaning unit 34 if remaining portions have different shapes (Step S44). In this case, different patterns are transferred to substrates 31. Accordingly, the substrates 31 are scrapped or the patterns of the substrates are restored (Step S48).

If ink remains in the pattern in Step S42, the determination section 16 determines that ink is not present in the predetermined range. In this case, the plate cylinder 24 is rotated and the remaining ink is removed by the cleaning unit 34 (Step S44). In this case, different patterns are transferred to substrates 31. Accordingly, the substrates 31 are scrapped (Step S48) or the patterns of the substrates 31 are restored.

In a case in which ink remains in an area wider than the pattern, the ejection observation or the like of the nozzles of the ink jet head 40 may be performed and the maintenance of the nozzles may be performed (Step S46).

In the printing method, the surface 25a of the printing plate 25 to which ink has been applied can be imaged by the plate surface observation unit 26 and whether or not the application of ink is appropriate can be determined by the determination section 16. Since it is possible to perform a check, which corresponds to not a direct printing result but an actual substrate, by performing a method of applying ink at the next time or later, the restoration of the surface of a plate, and the like in accordance with the determination result, the reliability of a check is improved. Accordingly, printing accuracy can be improved. Moreover, the substrate 31 is also not wasted for printing confirmation.

Further, since doctoring is not necessary, the scumming of the surface 25a of the printing plate 25 caused by doctoring and the durability of the printing plate 25 can also be improved.

The invention is basically adapted as described above. The printing apparatus and the printing method of the invention have been described above. However, the invention is not limited to the above-mentioned embodiments and it goes without saying that the invention may have various changes modifications without departing from the scope of the invention.

EXPLANATION OF REFERENCES

10: printing apparatus
12: printing apparatus body
14: storage section
16: determination section
18: control section
20: casing
22: image recording section
24: plate cylinder
25: printing plate
26: plate surface observation unit
28: restoration section
30: stage
31: substrate
32: drying unit
34: cleaning unit
36: maintenance section
40: ink jet head
42: alignment camera
43: ejection control unit
44: laser displacement meter
46: carriage
48: linear motor
50, 58: sub-tank
76: ejection observation unit
78: nozzle observation unit
A to D: alignment mark
G: spit area
T: ejection confirmation area
$G_{11}, G_{12}, G_{21}, G_{22}, G_{31}, G_{32}$: printing area

What is claimed is:

1. A printing apparatus that applies ink to a surface of a printing plate in the shape of a predetermined pattern and then transfers the ink applied in the shape of the pattern to a substrate, the apparatus comprising:
   an image recording section that applies the ink to the surface of the printing plate;
   a plate surface observation unit that acquires information about the surface of the printing plate to which the ink has been applied;
   a storage section that stores information about a reference shape serving as a reference of the surface of the printing plate to which ink has been applied;
   a determination section that compares the information about the reference shape stored in the storage section with the information about the surface of the printing plate to which the ink has been applied, which is obtained by the plate surface observation unit, and determines whether or not the surface of the printing plate to which the ink has been applied is present in a predetermined range of the reference shape; and
   a restoration section that restores the surface of the plate on the basis of a determination result of the determination section.

2. A printing apparatus that applies ink to a surface of a printing plate in the shape of a predetermined pattern and then transfers the ink applied in the shape of the pattern to a substrate, the apparatus comprising:
- an image recording section that applies the ink to the surface of the printing plate;
- a plate surface observation unit that acquires information about the surface of the printing plate to which the ink has been applied;
- a storage section that stores information about a reference shape serving as a reference of the surface of the printing plate to which ink has been applied; and
- a determination section that compares the information about the reference shape stored in the storage section with the information about the surface of the printing plate to which the ink has been applied, which is obtained by the plate surface observation unit, and determines whether or not the surface of the printing plate to which the ink has been applied is present in a predetermined range of the reference shape,
- wherein the plate surface observation unit is to acquire information about the surface of the printing plate from which the ink applied to the printing plate in the shape of the predetermined pattern has been transferred to the substrate, and
- the determination section determines whether or not the surface of the printing plate to which the ink has been applied is present in a predetermined range of the reference shape, by using information about the surface of the printing plate obtained before and after the transfer of the ink to the substrate.

3. The printing apparatus according to claim 1,
- wherein the plate surface observation unit is to acquire information about the surface of the printing plate from which the ink applied to the printing plate in the shape of the predetermined pattern has been transferred to the substrate, and
- the determination section determines whether or not the surface of the printing plate to which the ink has been applied is present in a predetermined range of the reference shape, by using information about the surface of the printing plate obtained before and after the transfer of the ink to the substrate.

4. The printing apparatus according to claim 1,
- wherein the application of the ink to the surface of the printing plate is performed multiple times, and the plate surface observation unit acquires information about the surface of the printing plate whenever the ink is applied to the surface of the printing plate.

5. The printing apparatus according to claim 1,
- wherein the image recording section uses an ink jet method.

6. The printing apparatus according to claim 1,
- wherein the printing plate is an intaglio plate, and the ink is applied to a recessed portion formed in the shape of a pattern.

7. A printing method that applies ink to a surface of a printing plate in the shape of a predetermined pattern and then transfers the ink applied in the shape of the pattern to a substrate, the method comprising:
- a step of applying ink to the surface of the printing plate;
- an acquisition step of acquiring information about the surface of the printing plate to which the ink has been applied;
- a determination step of comparing the information about a reference shape serving as a reference of the surface of the printing plate to which ink has been applied with the information about the surface of the printing plate to which the ink has been applied, and determining whether or not the surface of the printing plate to which the ink has been applied is present in a predetermined range of the reference shape; and
- a restoration step of restoring the surface of the plate on the basis of a result of the determination step.

8. The printing method according to claim 7, further comprising:
- a step of acquiring information about the surface of the printing plate after transferring the ink, which is applied to the printing plate in the shape of the predetermined pattern, to the substrate; and
- a step of determining whether or not the surface of the printing plate to which the ink has been applied is present in a predetermined range of the reference shape, by using information about the surface of the printing plate obtained before and after the transfer of the ink to the substrate.

9. The printing method according to claim 7,
- wherein the application of the ink to the surface of the printing plate is performed multiple times, and information about the surface of the printing plate is acquired whenever the ink is applied to the surface of the printing plate.

10. The printing method according to claim 7,
- wherein the application of the ink to the surface of the printing plate is performed by an ink jet method.

11. The printing method according to claim 7,
- wherein the printing plate is an intaglio plate, and the ink is applied to a recessed portion formed in the shape of a pattern.

* * * * *